(12) United States Patent
Tada et al.

(10) Patent No.: US 8,525,294 B2
(45) Date of Patent: Sep. 3, 2013

(54) SEMICONDUCTOR DEVICE

(75) Inventors: Akira Tada, Kawasaki (JP); Hiroki Tanabe, Kawasaki (JP); Yoshinori Okada, Kawasaki (JP); Ikuo Kudo, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 76 days.

(21) Appl. No.: 13/119,366

(22) PCT Filed: Jul. 2, 2009

(86) PCT No.: PCT/JP2009/062099
§ 371 (c)(1),
(2), (4) Date: May 31, 2011

(87) PCT Pub. No.: WO2010/032534
PCT Pub. Date: Mar. 25, 2010

(65) Prior Publication Data
US 2011/0272781 A1 Nov. 10, 2011

(30) Foreign Application Priority Data
Sep. 18, 2008 (JP) .................................. 2008-239211

(51) Int. Cl.
*H01L 21/822* (2006.01)
(52) U.S. Cl.
USPC ............ 257/531; 257/E23.141; 257/E21.022; 336/200
(58) Field of Classification Search
USPC .................. 336/200; 257/E23.141, E23.151, 257/E23.169, E23.175, 277, E21.022, 531; 29/604
See application file for complete search history.

(56) References Cited

U.S. PATENT DOCUMENTS

| | | | | | |
|---|---|---|---|---|---|
| 4,414,510 | A | * | 11/1983 | Milkovic | 324/252 |
| 5,479,695 | A | * | 1/1996 | Grader et al. | 29/602.1 |
| 6,031,445 | A | * | 2/2000 | Marty et al. | 336/200 |
| 6,262,468 | B1 | * | 7/2001 | Imam et al. | 257/531 |
| 6,310,393 | B1 | * | 10/2001 | Ogura et al. | 257/723 |
| 7,205,876 | B2 | * | 4/2007 | Lee et al. | 336/200 |
| 7,417,525 | B2 | * | 8/2008 | Lee et al. | 336/200 |
| 7,489,222 | B2 | * | 2/2009 | Edo et al. | 336/200 |
| 7,511,351 | B2 | * | 3/2009 | Anzai et al. | 257/422 |
| 7,667,566 | B2 | * | 2/2010 | Hsu et al. | 336/200 |
| 8,031,041 | B2 | * | 10/2011 | Sugahara | 336/200 |

(Continued)

FOREIGN PATENT DOCUMENTS

| | | | |
|---|---|---|---|
| JP | 2000-124406 | * | 4/2000 |
| JP | 2005-228981 | | 8/2005 |

(Continued)

OTHER PUBLICATIONS

Machine translation of Yajima, JP2006-165287.*
Machine translation of Kawaga, JP2007-165459.*
Machine translation of Eki, JP2006-66769.*
Machine translation of Soejima, JP2005-259969.*
Kuroda, Tadahiro, Ultra-low power short-range wirelss mobile information system, Journal of IEICE, vol. 90, No. 3, pp. 191-195 (2007) (translation by Phoenix Translations, Dec. 2012).*

(Continued)

*Primary Examiner* — Fernando L Toledo
*Assistant Examiner* — Victoria K Hall
(74) *Attorney, Agent, or Firm* — McDermott Will & Emery LLP

(57) ABSTRACT

A package-on-package includes a semiconductor package, and a coil provided at the semiconductor package. The semiconductor package includes a bottom face, and a solder ball protruded from the bottom face. An axis of the coil is inclined with respect to the normal line of the bottom face.

7 Claims, 20 Drawing Sheets

(56) References Cited

U.S. PATENT DOCUMENTS

| | | | | |
|---|---|---|---|---|
| 2002/0095775 | A1* | 7/2002 | Ahn et al. | 29/604 |
| 2002/0095776 | A1* | 7/2002 | Ahn et al. | 29/604 |
| 2002/0095778 | A1* | 7/2002 | Ahn et al. | 29/604 |
| 2003/0013264 | A1* | 1/2003 | Yeo et al. | 438/381 |
| 2006/0227518 | A1* | 10/2006 | Nishio et al. | 361/748 |
| 2007/0246805 | A1* | 10/2007 | Zhang et al. | 257/659 |
| 2007/0274198 | A1 | 11/2007 | Kuroda et al. | |
| 2007/0290782 | A1* | 12/2007 | Yokoyama et al. | 336/200 |
| 2010/0164823 | A1* | 7/2010 | Kubo et al. | 343/788 |
| 2011/0006443 | A1* | 1/2011 | Noguchi et al. | 257/786 |

FOREIGN PATENT DOCUMENTS

| | | | |
|---|---|---|---|
| JP | 2005-229766 | * | 8/2005 |
| JP | 2005-259969 | * | 9/2005 |
| JP | 2006-066454 | | 3/2006 |
| JP | 2006-66454 | * | 3/2006 |
| JP | 2006-66769 | * | 3/2006 |
| JP | 2006-165287 | * | 6/2006 |
| JP | 2007-165459 | * | 6/2007 |
| JP | 2008-004612 | | 1/2008 |
| JP | 2008-4612 | * | 1/2008 |
| JP | 2008-135430 | * | 6/2008 |

OTHER PUBLICATIONS

Machine translation, JP 2008-4612 Yokoyama, translation date: Jul. 22, 2013, JPO & Japio, all pages.*
Machine translation, JP 2008-135430 Noda, translation date: Jul. 22, 2013, JPO & Japio, all pages.*
Machine translation, JP 2005-259969 Soejima, translation date: Jul. 22, 2013, JPO & Japio, all pages.*
Machine translation, JP 2000-124406 Taniguchi, translation date: Jul. 22, 2013, JPO & Japio, all pages.*
Machine translation, JP 2006-66454 Kuroda, translation date: Jul. 22, 2013, JPO & Japio, all pages.*
Machine translation, JP 2005-229766 Ono, translation date: Jul. 22, 2013, JPO & Japio, all pages.*
Steven Spar, partial translation (Ground 3), JPO office action in Japanese Patent Application No. 2010-529678 (Jun. 25, 2013), translation date: Jul. 22, 2013, all pages.*
Tadahiro Kuroda, "Wireless-low-power Short-range Wireless Mobile Information Systems," the Intstitute of Electronics, Information and Communication Engineers of Japan (IEICE), vol. 90, No. 3, pp. 191-195, with partial English translation.
Japan Office Action issued in Japanese Application No. 2010-529678 dated Jun. 25, 2013.

* cited by examiner

US 8,525,294 B2

SEMICONDUCTOR DEVICE

RELATED APPLICATIONS

This application is the U.S. National Phase under 35 U.S.C. §371 of International Application No. PCT/JP2009/062099, filed on Jul. 2, 2009, which in turn claims the benefit of Japanese Application No. 2008-239211, filed on Sep. 18, 2008, the disclosures of which Applications are incorporated by reference herein.

TECHNICAL FIELD

The present invention relates to semiconductor devices, more particularly, a semiconductor device including a coil.

BACKGROUND ART

The increase in the speed of inter-chip communication raises expectations for inter-chip wireless communication techniques. Wireless communication is also expected to be effective in the pass/fail determination of acceptable chip products, in addition to increasing the communication rate. Inter-chip wireless communication is based on the two schemes of capacitive coupling and magnetic coupling. Magnetic coupling is advantageous in that communication is allowed even between three or more chips. According to inter-chip wireless communication techniques employing magnetic coupling, communication in 1 Tbit/s is realized by aligning 1000 channels having a transfer rate of 1 Gbit/s. Electric power normalized at the rate, i.e. the communication energy per bit, now attains 0.14 pJ/bit. This is disclosed by Tadahiro Kuroda in "Ultra-low power Short-range Wireless Mobile Information Systems", the Institute of Electronics, Information and Communication Engineers of Japan (IEICE), Vol. 90, No. 3, pp. 191-195 (Non-Patent Document 1).

A conventional inter-chip wireless communication approach is disclosed in Japanese Patent Laying-Open No. 2005-228981 (Patent Document 1), for example. The electronic circuit of Patent Document 1 has three layers of an LSI chip stacked, and a bus for interconnection of the three layers of LSI chips is formed. At each of the three layers of LSI chips, a transmission coil and reception coil are formed. The transmission coil and reception coil are formed on the LSI chip. Accordingly, communication is realized between vertically-located LSI chips. In communication thereof, it is necessary to set the position of the coils in alignment since deviation in the distance between the layers and/or misalignment in plane between upper and lower coils will disturb the communication.

PRIOR ART DOCUMENTS

Patent Documents

Patent Document 1: Japanese Patent Laying-Open No. 2005-228981

Non-Patent Documents

Non-Patent Document 1: Tadahiro Kuroda, "Ultra-low power Short-range Wireless Mobile Information Systems", the Institute of Electronics, Information and Communication Engineers of Japan (IEICE), Vol. 90, No. 3, pp. 191-195, March 2007.

SUMMARY OF THE INVENTION

Problems to be Solved by the Invention

Since the coil had an axis parallel to the normal line of the main plane of the LSI chip in conventional wireless communication techniques, communication in a direction other than the vertical direction was not possible. Therefore, an object of the present invention is to provide a semiconductor device allowing communication in a direction other than the direction of the normal line of the main plane of a semiconductor package.

Means for Solving the Problems

A semiconductor device according to an embodiment of the present invention includes a semiconductor package, and a coil. The semiconductor package includes a main plane and a connection electrode protruding from the main plane. The coil has at least a portion provided at the semiconductor package. The axis of the coil is inclined with respect to the normal line of the main plane.

Advantage of the Invention

By the semiconductor device according to an embodiment of the present invention, communication in a direction other than the direction of the normal line of the main plane of a semiconductor package is allowed.

EMBODIMENTS OF INVENTION

Embodiments of the present invention will be described hereinafter based on the drawings.

First Embodiment

Figure 1:
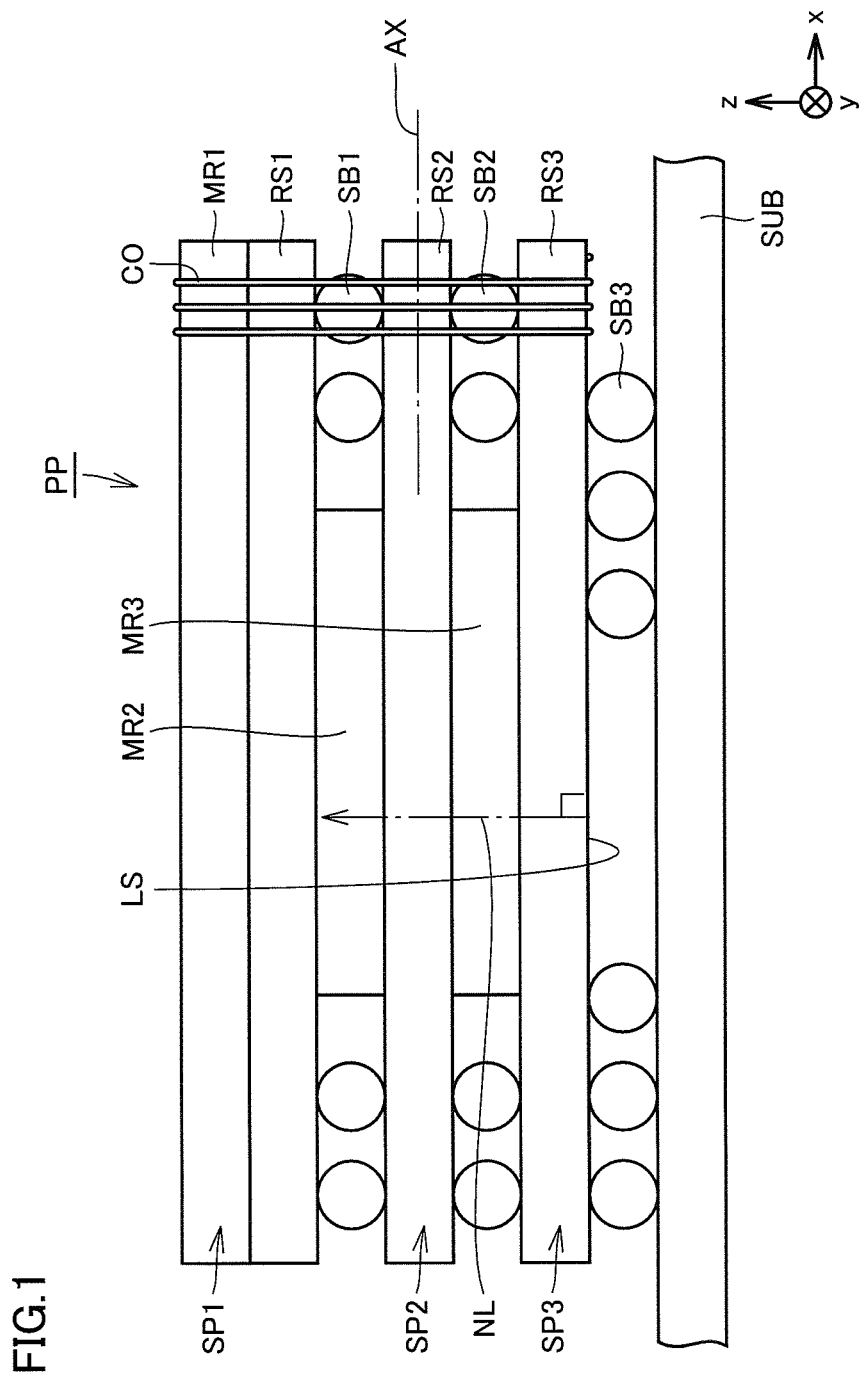
FIG. 1 is a front view of a configuration of a semiconductor device according to a first embodiment of the present invention.
Figure 2:
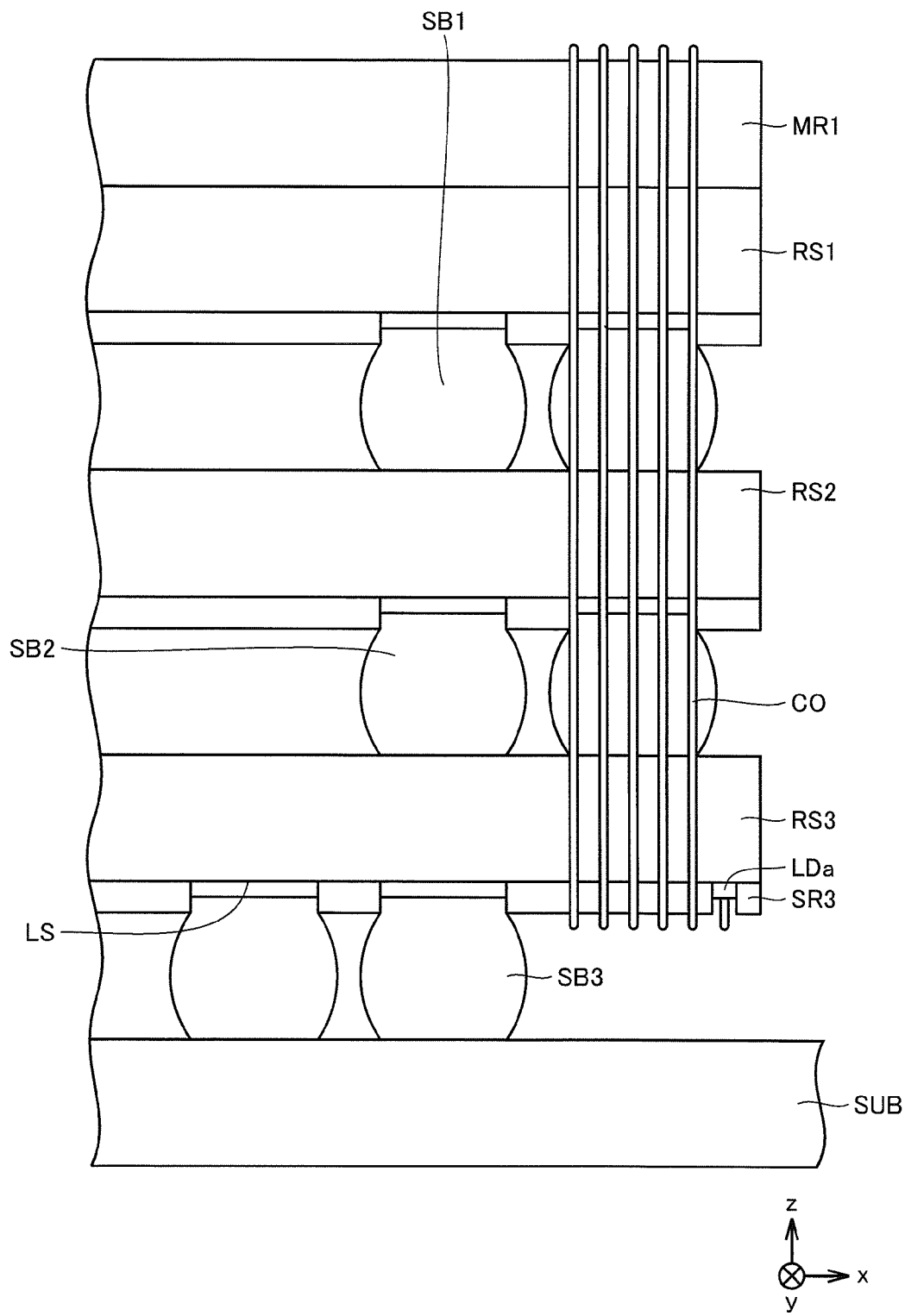
FIG. 2 is an enlarged view corresponding to the right end region of FIG. 1.
Figure 3:
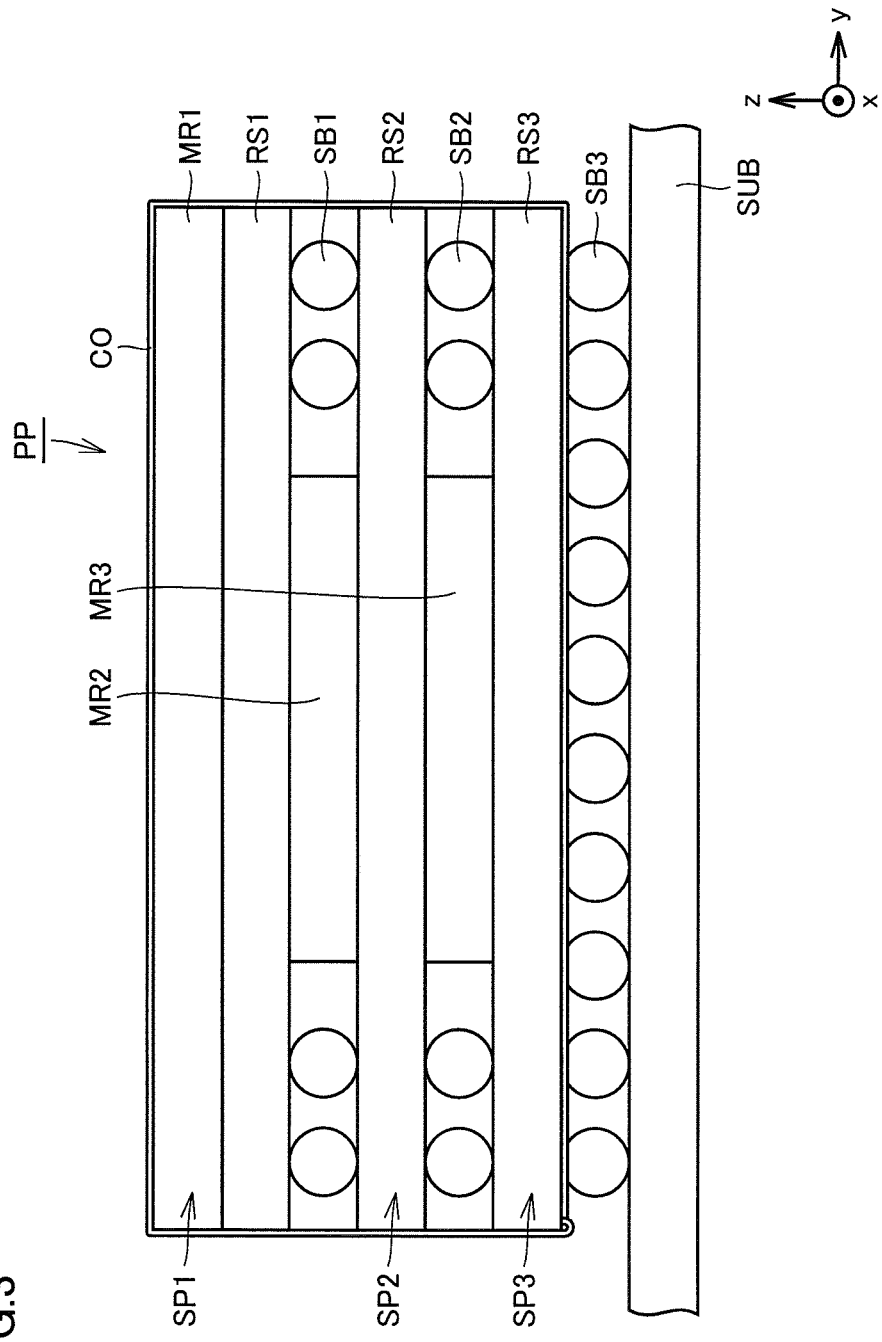
FIG. 3 is a side view of a configuration of the semiconductor device according to the first embodiment of the present invention.
Figure 4:
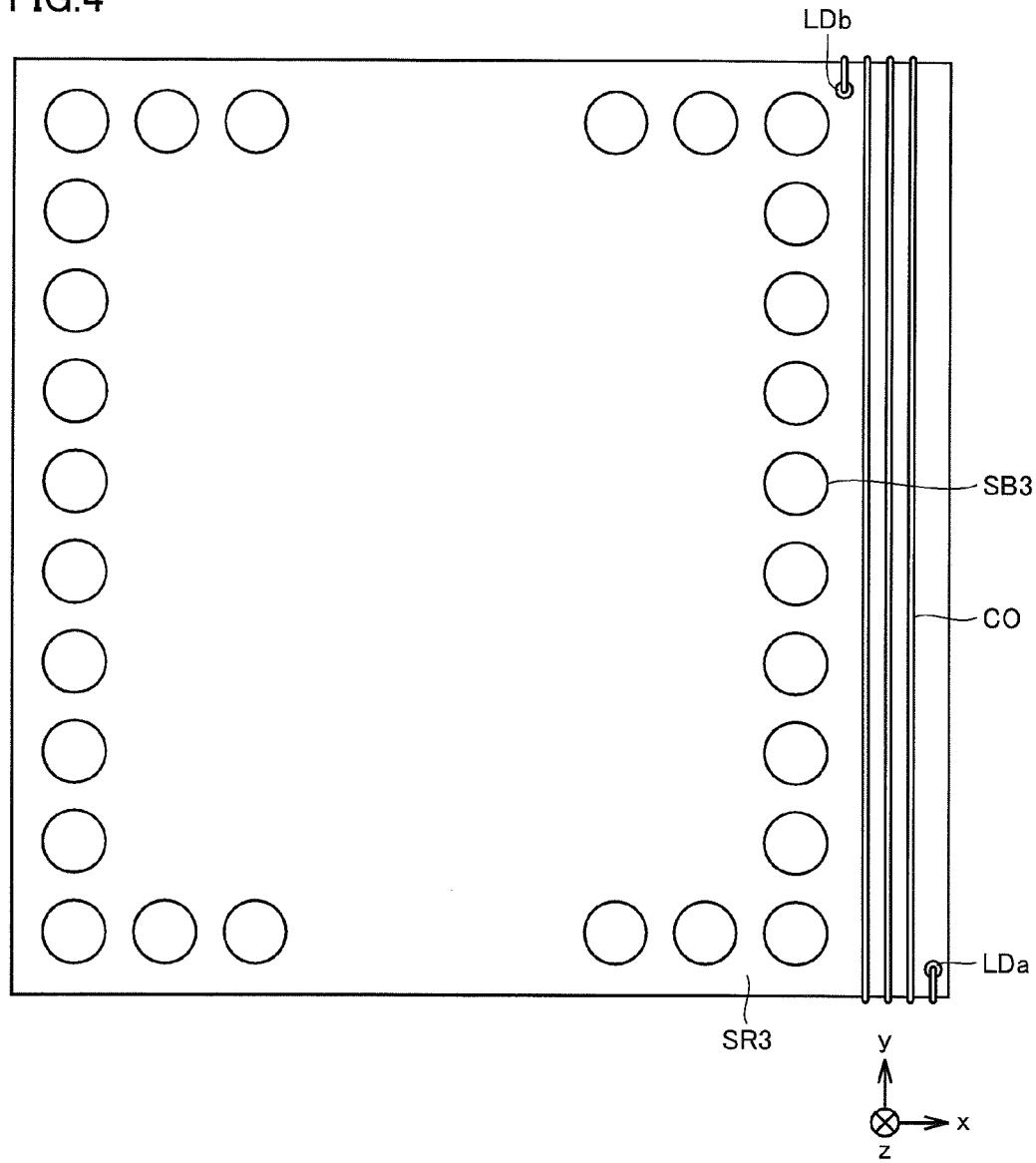
FIG. 4 is a bottom view of a resin substrate RS3 in the semiconductor device according to the first embodiment of the present invention.

FIGS. 1-4 represent a configuration of a semiconductor device according to a first embodiment of the present invention. FIG. 1 is a front view; FIG. 2 is an enlarged view corresponding to the right end region of FIG. 1; FIG. 3 is a side view; and FIG. 4 is a bottom view of a resin substrate RS3. Referring to FIGS. 1-4, a package-on-package (PoP) PP that is a semiconductor device according to the present embodiment is mounted on a substrate SUB, including each of semiconductor packages SP1-SP3, and a coil CO. Each of semiconductor packages SP1-SP3 is arranged parallel to the xy plane, and has a rectangular plane configuration, for example. Semiconductor package SP2 is mounted above semiconductor package SP3 (semiconductor package). Semiconductor package SP1 is mounted above semiconductor package SP2. Coil CO is formed of a conducting wire, wound around semiconductor packages SP1-SP3. Thus, each of semiconductor packages SP1-SP3 has a portion of coil CO provided. Semiconductor packages SP1-SP3 and coil CO may be sealed with a mold resin (not shown).

Semiconductor package SP1 includes a mold resin MR1, a resin substrate RS1, and a plurality of solder balls SB1. Mold resin MR1 is disposed on a rectangular resin substrate RS1, having a plane configuration identical to that of resin substrate RS1. A semiconductor chip (not shown) is embedded in mold resin MR1. A plurality of solder balls SB 1 are arranged at the bottom face of resin substrate RS1. Semiconductor package SP1 is electrically connected with semiconductor package SP2 through the plurality of solder balls SB1. Similarly, semiconductor package SP2 includes a mold resin MR2, a resin substrate RS2, and a plurality of solder balls SB2. Mold resin MR2 has a rectangular shape, and is arranged at the center area of the top face of rectangular resin substrate RS2. A semiconductor chip (not shown) is embedded in mold resin MR2. A plurality of solder balls SB2 are arranged at a bottom face of resin substrate RS2. Semiconductor package SP2 is electrically connected with semiconductor package SP3 through the plurality of solder balls SB2. Semiconductor package SP3 includes a mold resin MR3, a resin substrate RS3, and a plurality of solder balls SB3. Mold resin MR3 has a rectangular shape, and is arranged at the center area of the top face of rectangular resin substrate RS3. A semiconductor chip (not shown) is embedded in mold resin MR3. A plurality of solder balls SB3 (connection electrode) are arranged at a bottom face LS (main plane) of resin substrate RS3. Semiconductor package SP3 is electrically connected with substrate SUB through the plurality of solder balls SB3.

Referring particularly to FIGS. 1 and 3, bottom face LS (main plane) of resin substrate RS3 is located within a plane parallel to the xy plane. In contrast, the loop of coil CO is located in a plane parallel to the yz plane. Accordingly, the axis AX of coil CO is in a direction parallel to the x axis. As a result, axis AX is inclined with respect to normal line NL of bottom face LS. Axis AX and normal line NL are orthogonal to each other.

Referring particularly to FIG. 4, lands LDa and LDb are provided in the vicinity of the region (right side in the drawing) where coil CO is provided at the bottom face of resin substrate RS3. Lands LDa and LDb are formed by having a solder resist SR3 removed from the surface of resin substrate RS3. Coil CO has either end electrically connected to the semiconductor chip in mold resin MR3 through each of lands LDa and LDb. Solder balls SB3 are provided at arbitrary positions in accordance with the perimeter of resin substrate RS3. Solder balls SB3 protrude from bottom face LS of resin substrate RS3.

Figure 5:
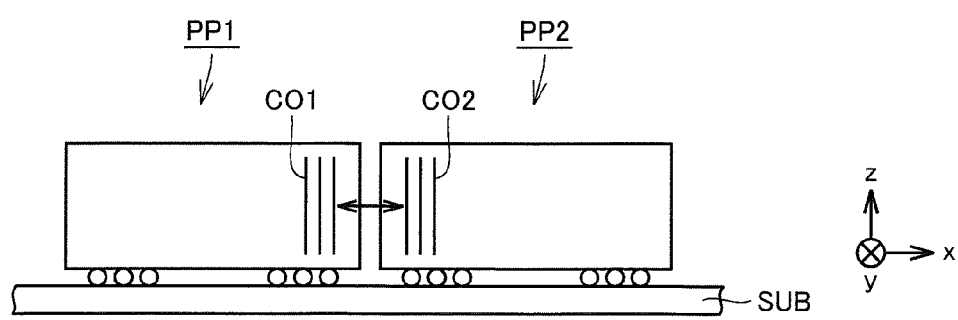
FIG. 5 is a schematic diagram to describe a communication method by the semiconductor device according to the first embodiment of the present invention.

FIG. 5 is a schematic diagram to describe a communication method by the semiconductor device according to the first embodiment of the present invention. Referring to FIG. 5, a package-on-package PP1 and a package-on-package PP2 are arranged adjacent to each other on substrate SUB. Each of package-on-packages PP1 and PP2 has a configuration similar to that of package-on-package PP shown in FIGS. 1-4. Package-on-packages PP1 and PP2 are arranged such that the axis of a coil CO1 of package-on-package PP1 matches the axis of a coil CO2 of package-on-package PP2. Both the axis of coil CO1 and the axis of coil CO2 are in the direction of the x axis. The distance between coil CO1 and coil CO2 is preferably as short as possible. By such an arrangement, inductive coupling is configured by coils CO1 and CO2, allowing communication in the direction of the x axis between package-on-package PP1 and package-on-package PP2.

An example of a wireless communication method in the semiconductor device of the present embodiment, between package-on-package PP1 and package-on-package PP2, will be described hereinafter.

Figure 6:
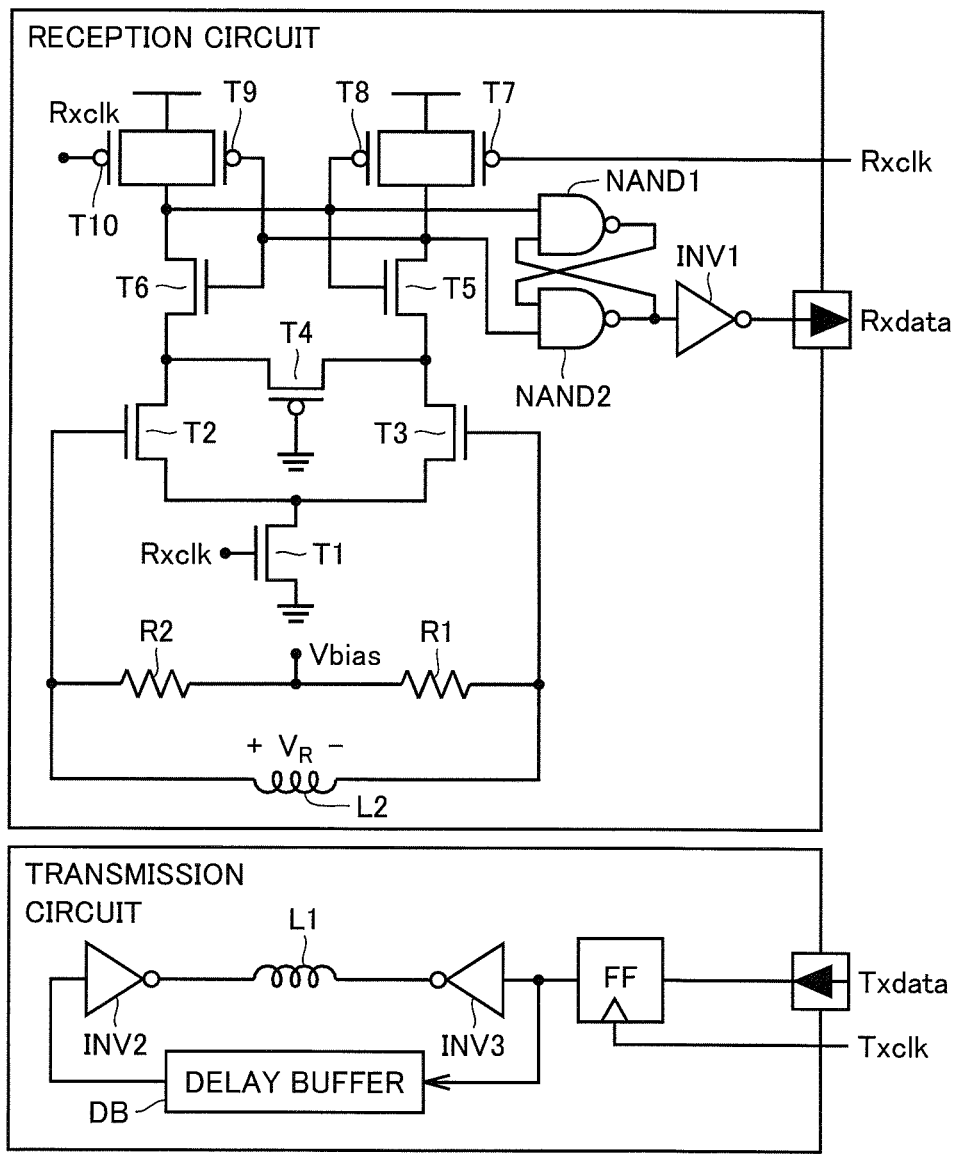
FIG. 6 represents a specific configuration of a transmission circuit and a reception circuit in the semiconductor device of the first embodiment of the present invention.

FIG. 6 represents a specific configuration of a transmission circuit and a reception circuit in the semiconductor device according to the first embodiment of the present invention. Referring to FIGS. 5 and 6, a transmission circuit is provided at package-on-package PP1, and a reception circuit is provided at the semiconductor chip of package-on-package PP2. The transmission circuit includes a storage element FF, a delay buffer DB, a first transmission buffer INV2 and a second transmission buffer INV3. These elements are provided in the semiconductor chip of package-on-package PP1. The transmission circuit further includes a transmission coil L1 corresponding to coil CO (FIG. 1).

A transmission clock (synchronizing signal) $T_{xclk}$, and transmission data $T_{xdata}$ in synchronism with the transmission clock are input to the transmission circuit. The input transmission data $T_{xdata}$ is held in storage element FF to be input to first transmission buffer INV2 and second transmission buffer INV3. Delay buffer DB that is a delay element is provided between storage element FF and first transmission buffer INV2, causing a difference in the input time to first transmission buffer INV2 and the input time to second transmission buffer INV3. The output of first transmission buffer INV2 and the output of second transmission buffer INV3 are connected to each of the ends of transmission coil L1. By such a configuration, current flows to transmission coil L1 for just the signal propagation delay time of delay buffer DB only when there is change in the transmission data.

The reception circuit includes transistors T1-T10, resistors R1 and R2, NAND circuits NAND1 and NAND2, and a reception buffer INV1. These elements are provided in the semiconductor chip of package-on-package PP2. The reception circuit further includes a reception coil L2 corresponding to coil CO (FIG. 1).

An externally applied reception clock (synchronizing signal) $R_{xclk}$ is input to the reception circuit. Reception coil L2 has either end electrically connected to a gate terminal of each of transistors T2 and T3. Transistors T2 and T3 receive a signal from reception coil L2. Reception coil L2 also has either end electrically connected to a bias voltage $V_{bias}$ through each of resistors R1 and R2. Accordingly, the center voltage of the amplitude generated across reception coil L2 at the time of signal reception can be set at a level optimum for signal amplification. The source terminals of transistors T2 and T3 are electrically connected to transistor T1 for tail current source generation. Transistor T1 has its source terminal connected to ground, and receives reception clock $R_{xclk}$ at its gate terminal. At the drain side of transistors T2 and T3, a set of transistors T5 and T8, and a set of transistors T6 and T9 constitute an inverter. These inverters are connected in a loop. The wiring joining the inverters are electrically connected to each of NAND circuits NAND1 and NAND2. NAND circuits NAND1 and NAND2 constitute a latch. The data received at a differential amplifier has its value altered in synchronism with reception clock $R_{xclk}$ applied to transistor T1. By NAND circuits NAND1 and NAND2, a value is taken in with the reception signal as digital data only when there is change in the value. The value is maintained during the period where there is no change in the input value. For the purpose of precharging the differential amplifier and holding the latched value during an L (low) period of reception clock $R_{xclk}$, each of transistors T7 and T10 is connected at the reception circuit. Transistor T4 is connected to the reception circuit to prevent erroneous inversion of the value of reception data $R_{xdata}$ caused by the effect of noise generated by transistors T7 and T10 despite that there is no change in the reception signal from reception coil L2.

Figure 7:
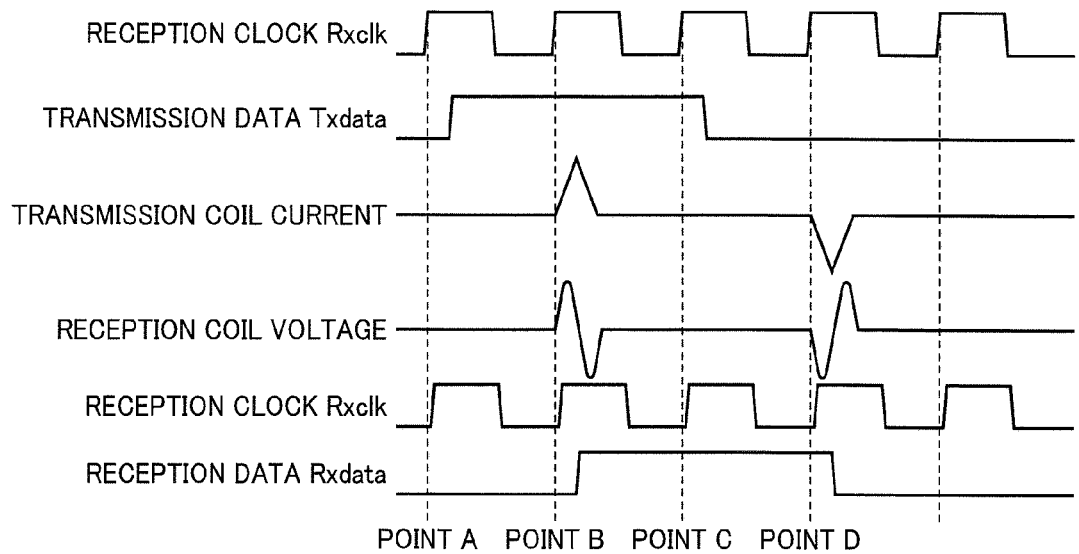
FIG. 7 is a waveform diagram for describing the operation of the transmission circuit and reception circuit according to the first embodiment of the present invention.

FIG. 7 represents a waveform diagram for describing the operation of the transmission circuit and reception circuit according to the first embodiment of the present invention. Referring to FIGS. 6 and 7, in the state where transmission data $T_{xdata}$ of an L (low) level is input, the outputs of first transmission buffer INV2 and second transmission buffer INV3 both take a steady state with an H (high) level. From this state, transmission data $T_{xdata}$ is driven from L to H at the time of point A. This signal is introduced into storage element FF at point B, and immediately applied to second transmission buffer INV3. At this stage, the output of second transmission buffer INV3 attains an L level. Since the output of first transmission buffer INV2 is still at the H level, the current flows from first transmission buffer INV2 towards second transmission buffer INV3 at transmission coil L1. At an elapse of the delay time of delay buffer DB, the output of first transmission buffer INV2 attains an L level, whereby the outputs of first and second transmission buffers INV2 and INV3 attain equal potential. Thus, current will not flow through transmission coil L1.

By the current change at points B-C of the transmission coil, voltage is generated at reception coil L2. The center voltage of the oscillation of the voltage is $V_{bias}$. This voltage change at the reception coil is amplified by the latching differential amplifier, and the value is held by the latch, whereby reception data $R_{xdata}$ exhibits the change of points B-C.

Transmission data $T_{xdata}$ does not change at point C and is kept at the H level. In this case, the input to transmission coil L1 at point C does not change. The voltage of reception coil L2 also does not change. As a result, reception data $R_{xdata}$ is maintained.

When transmission data $T_{xdata}$ is driven to an L level from an H level at point C, this signal is introduced into storage element FF at point D to be immediately input to second transmission buffer INV3, causing the output of second transmission buffer INV3 to be changed from an L level to an H level. At this stage, the output of first transmission buffer INV2 is delayed in the change from the L level to the H level by delay buffer DB. Current flows from second transmission buffer INV3 towards first transmission buffer INV2. At an elapse of the delay time of delay buffer DB, the output of first transmission buffer INV2 attains an H level. The outputs of first and second transmission buffers INV2 and INV3 become equal potential. As a result, current does not flow at transmission coil L1.

By the current change at points D and et seq. of the transmission coil, voltage is generated at reception coil L2. The center voltage of the oscillation of the voltage is $V_{bias}$. This voltage change of the reception coil is amplified by a latching differential amplifier, and the value is held by the latch, causing reception data $R_{xdata}$ to exhibit the change indicated at points D and et seq. By the method described above, data is transmitted from package-on-package PP1 to package-on-package PP2 based on the change in the magnetic field generated from coil CO1.

Package-on-package PP of the present embodiment includes a semiconductor package SP3 having a bottom face LS and a solder ball SB3 protruding from bottom face LS, and a coil CO having at least a portion provided at semiconductor package SP3. Axis AX of coil CO is inclined with respect to normal line NL of bottom face LS.

According to package-on-package PP of the present embodiment, communication in a direction other than the direction of the z axis is allowed since axis AX of coil CO is inclined with respect to normal line NL of bottom face LS.

Further, communication within the xy plane is allowed since axis AX is orthogonal to normal line NL.

Moreover, since at least a portion of the coil is configured by a conducting wire, the coil can be formed mechanically.

In addition, the cost to mount the coil can be reduced, as compared to the case where a coil is provided for each semiconductor package, since one coil CO is shared among semiconductor packages SP1-SP3.

Second Embodiment

Figure 8:
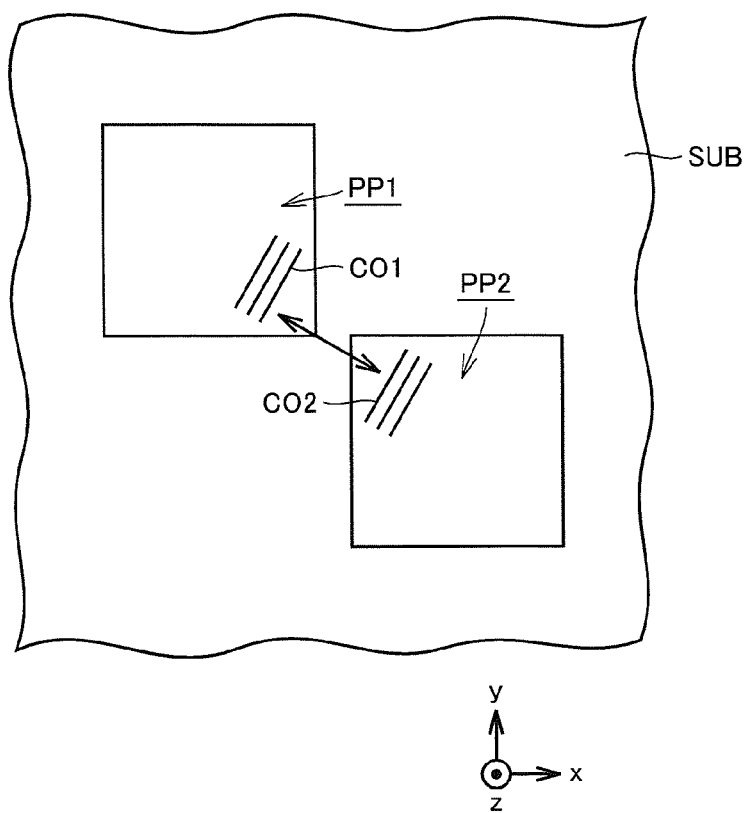
FIG. 8 is a schematic diagram for describing a communication method by a semiconductor device according to a second embodiment of the present invention.

FIG. 8 is schematic diagram to describe a communication method by a semiconductor device according to a second embodiment of the present invention. Referring to FIG. 8, the axis of coil CO1 of package-on-package PP1 and the axis of coil CO2 of package-on-package PP2 are both in a direction inclined with respect to the x axis at the xy plane in the present embodiment. Further, package-on-package PP1 and package-on-package PP2 are arranged such that the axis of coil CO1 matches the axis of coil CO2. Accordingly, coil CO1 and coil CO2 establish inductive coupling, allowing communication within the xy plane between package-on-package PP1 and package-on-package PP2.

Figure 9:
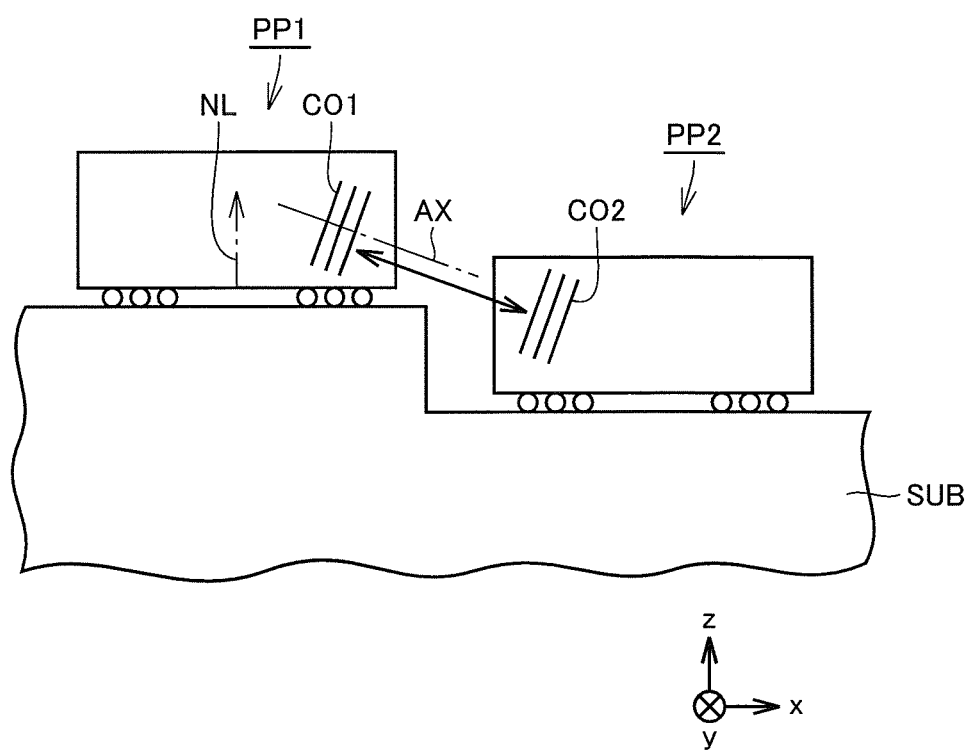
FIG. 9 is a schematic diagram for describing another communication method by the semiconductor device according to the second embodiment of the present invention.

FIG. 9 is a schematic diagram to describe another communication method of the semiconductor device according to the second embodiment of the present invention. Referring to FIG. 9, according to the configuration, the axis of coil CO1 of package-on-package PP1 and the axis of coil CO2 of package-on-package PP2 are in a direction inclined with respect to the x axis in the xz plane. Package-on-package PP1 and package-on-package PP2 are arranged such that the axis of coil CO1 and the axis of coil CO2 matches. By such an arrangement, inductive coupling is established by coils CO1 and CO2, allowing communication in the xz plane between package-on-package PP1 and package-on-package PP2.

The configuration of FIG. 9 is particularly applicable to the case where a detachable module with a package-on-package PP2 is inserted into a device such as a cellular phone or a digital camera incorporating a package-on-package PP1.

As described above, the axis of the coil in the present invention is at least inclined with respect to the normal line (z axis) of the main plane (xy plane) of the semiconductor package.

Third Embodiment

Figure 10:
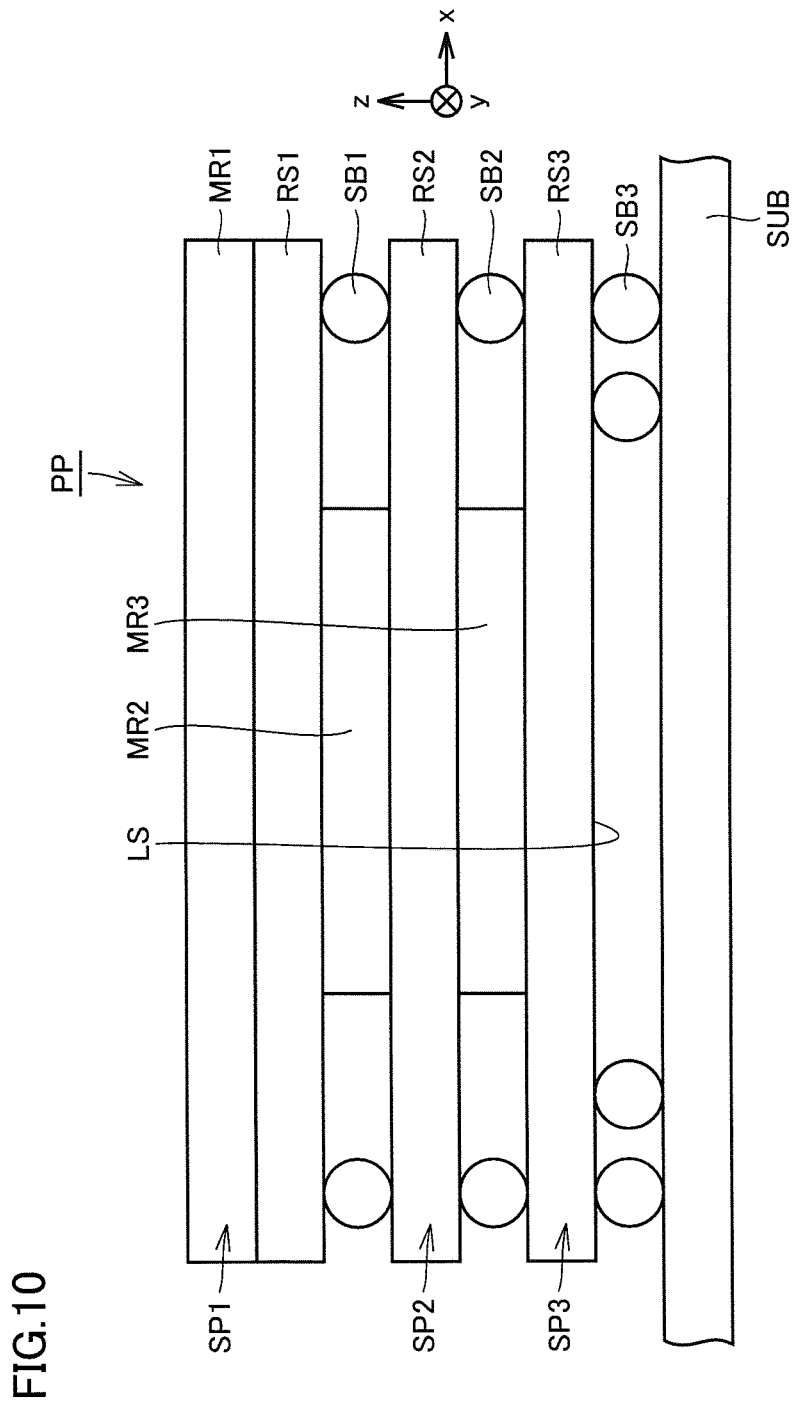
FIG. 10 is a front view of a configuration of a semiconductor device according to a third embodiment of the present invention.
Figure 11:
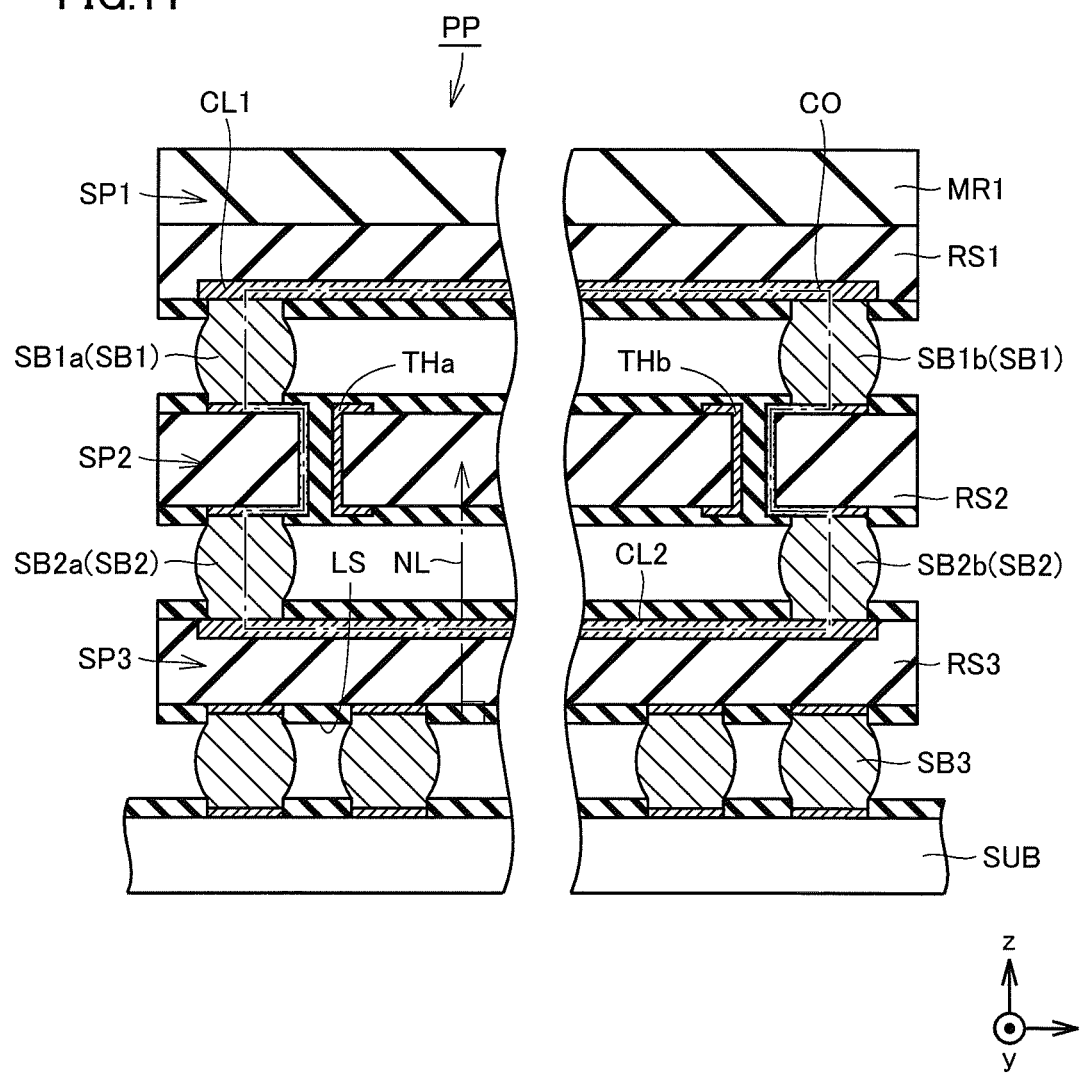
FIG. 11 is an enlarged sectional view corresponding to either end regions of FIG. 10.
Figure 12:
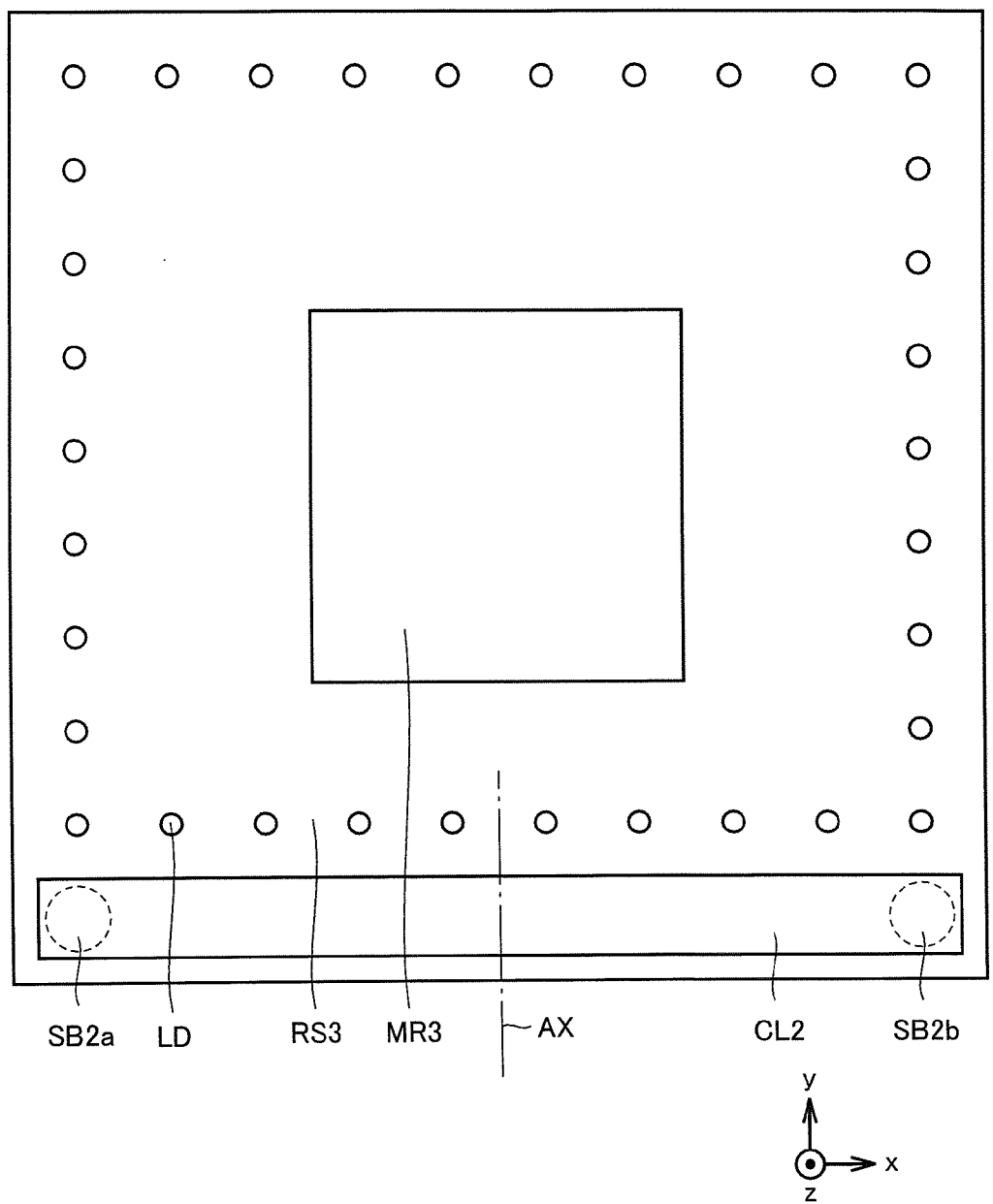
FIG. 12 is a top view of a resin substrate RS3 in the semiconductor device according to the third embodiment of the present invention.

FIGS. 10-12 represent a configuration of a semiconductor device according to a third embodiment of the present invention. FIG. 10 is a front view; FIG. 11 is an enlarged sectional view corresponding to both end regions of FIG. 10; and FIG. 12 is a top view of a resin substrate RS3. Referring to FIGS. 10-12, package-on-package PP that is a semiconductor device of the present embodiment differs from the package-on-package of the first embodiment in that the coil is formed within the package-on-package, and not externally exposed.

Referring particularly to FIG. 11, a conductor layer CL1 is formed at the bottom face of resin substrate RS1. A conductor layer CL2 is formed at the top face of resin substrate RS3. Each of conductor layers CL1 and CL2 extends in the direction of the x axis (horizontally in FIG. 11). Through holes THa and THb are formed at resin substrate RS2. Each of through holes THa and THb is formed having a conductor grown at the inner wall of the hole penetrating resin substrate RS2, and functions to electrically connect the top face and bottom face of resin substrate RS2.

Conductor layer CL1 has its left end portion electrically connected with the left end portion of conductor layer CL2 via a solder ball SB1$a$ (upper connection electrode) of semiconductor package SP1 (upper semiconductor package), through hole THa, and a solder ball SB2$a$ of semiconductor package SP2. Similarly, conductor layer CL1 has its right end portion electrically connected with the right end portion of conductor layer CL2 through a solder ball SB1$b$ (upper connection electrode) of semiconductor package SP1, through hole THb, and a solder ball SB2$b$ of semiconductor package SP2. As a result, coil CO is formed by conductor layer CL1, solder ball SB1$a$, through hole THa, solder ball SB2$a$, conductor layer CL2, solder ball SB2$b$, through hole THb, and solder ball SB1$b$. Axis AX of coil CO (FIG. 12) is in the direction of the y axis, and normal line NL of bottom face LS of semiconductor package SP3 is in the direction of the z axis. In other words, axis AX and normal line NL are orthogonal to each other.

As shown in FIG. 12, a plurality of lands LD are formed at the top face of resin substrate RS3. Each of lands LD is located at an arbitrary position in accordance with the perimeter of resin substrate RS3. Conductor layer CL2 is provided between land LD and the edge of the resin substrate along one side of resin substrate RS3.

The remaining configuration of package-on-package PP is similar to that of the package-on-package of the first embodiment. Corresponding members have the same reference character allotted, and description thereof will not be repeated.

According to package-on-package PP of the present embodiment, advantages similar to those of the package-on-package of the first embodiment can be provided.

In addition, since at least a portion of coil CO is configured by solder balls SB1$a$ and SB1$b$, the mechanical work of winding a coil can be dispensed with. Therefore the cost and time required for mounting a coil can be reduced.

Furthermore, since a portion of coil CO is configured by conductor layer CL2 provided in semiconductor package SP3 and conductor layer CL1 provided in semiconductor package SP1, the cost and time required for mounting a coil can be further reduced. Moreover, the radius of the coil can be increased, as compared to the case where a coil is formed at the semiconductor chip.

Fourth Embodiment

Figure 13:
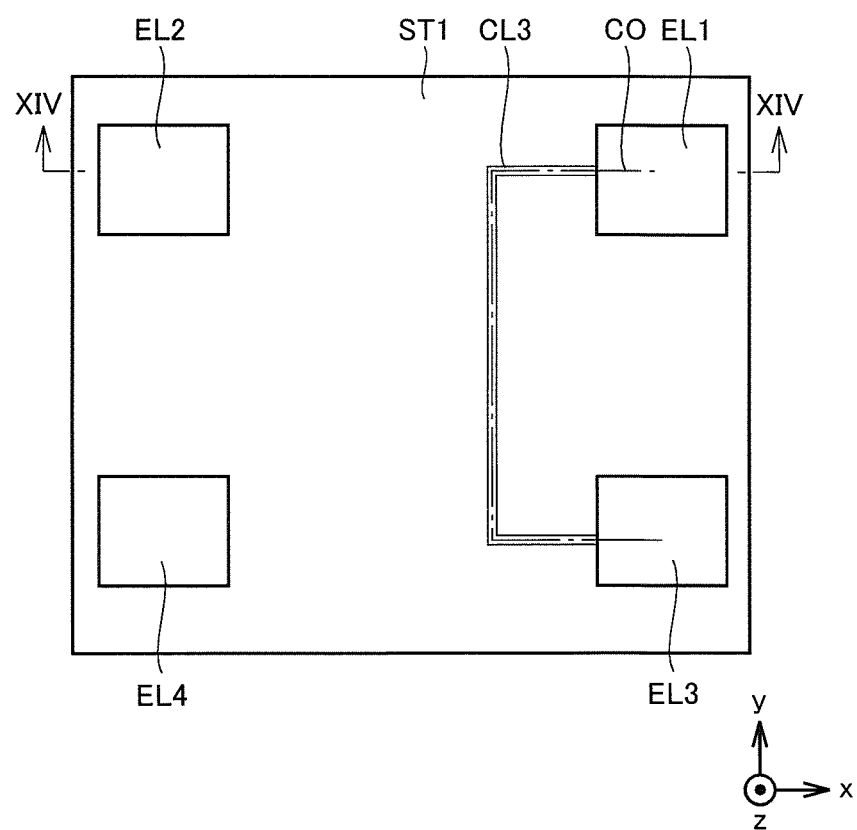
FIG. 13 represents a plane layout of electrodes and conductor layers in a semiconductor device according to a fourth embodiment of the present invention.
Figure 14:
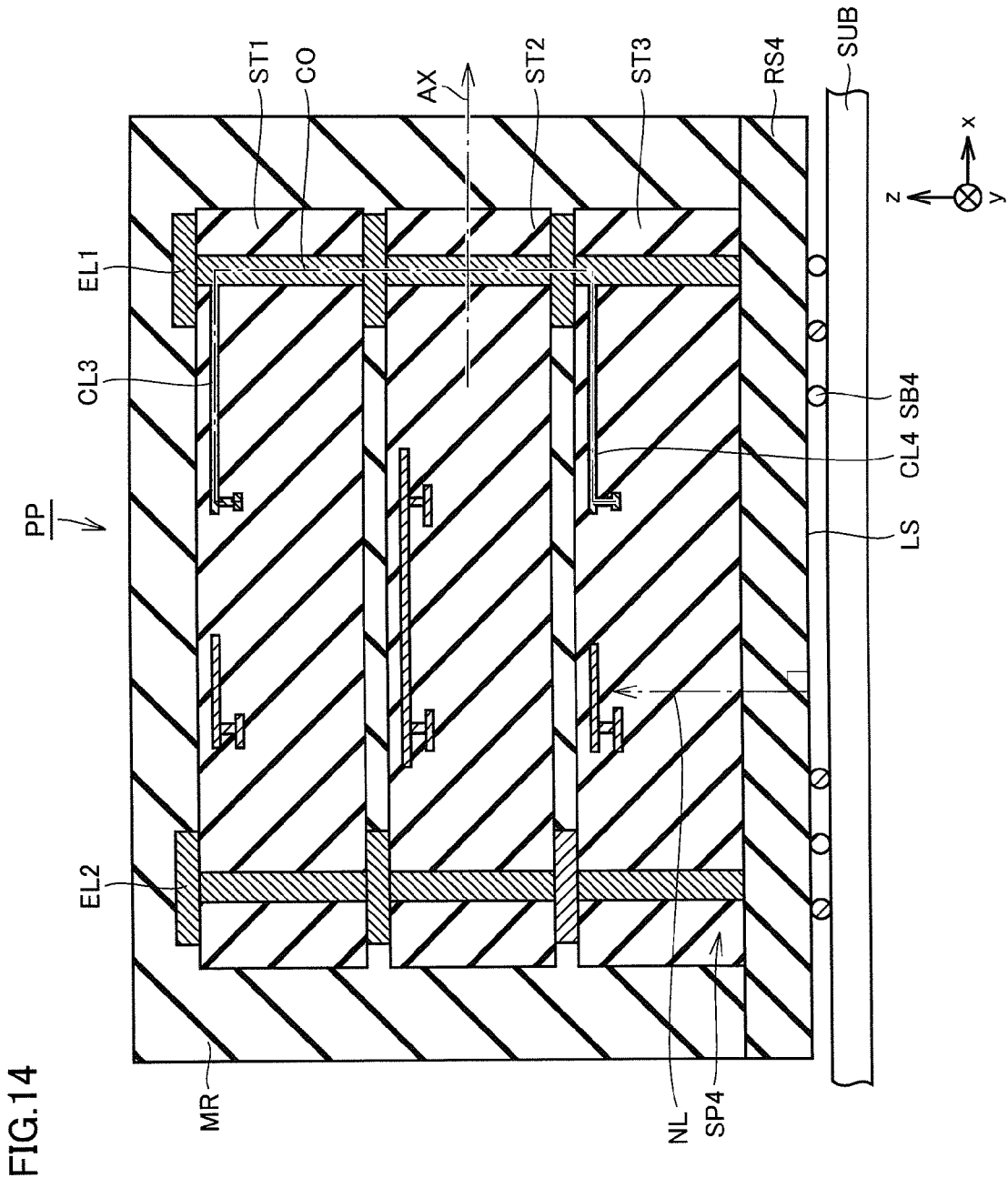
FIG. 14 is a sectional view taken along line XIV-XIV of FIG. 13.

FIGS. 13 and 14 represent a configuration of a semiconductor device according to a fourth embodiment of the present invention. FIG. 13 represents a plan layout of electrodes and conductor layers. FIG. 14 is a sectional view taken along line XIV-XIV of FIG. 13. Referring to FIGS. 13 and 14, package-on-package PP that is a semiconductor device of the present embodiment is mounted on a substrate SUB, and includes only one semiconductor package SP4.

Semiconductor package SP4 includes three semiconductor chips ST1-ST3 formed of silicon, for example, a resin substrate RS4, a plurality of solder balls SB4 (connection electrode) protruding from bottom face LS, and a mold resin MR. Semiconductor chip ST3 is stacked on resin substrate RS4. Semiconductor chip ST2 is stacked on semiconductor chip ST3. Semiconductor chip ST1 is stacked on semiconductor chip ST2. Semiconductor chips ST1-ST3 are sealed with mold resin MR.

In the vicinity of the four corners of semiconductor package SP having a rectangular plane configuration, electrodes EL1-EL4 formed of Au, for example, are provided. Each of electrodes EL1-EL4 penetrates semiconductor chips ST1-ST3. Each of semiconductor chips ST1-ST3 is electrically connected with each other by electrodes EL1-EL4. A conductor layer CL3 is formed in semiconductor chip ST1. The upper end of electrode EL1 (through electrode) and the upper end of electrode EL3 (through electrode) are electrically connected with each other through conductor layer CL3. Similarly, a conductor layer CL4 is formed in semiconductor chip ST3. The lower end of electrode EL1 and the lower end of electrode EL3 are electrically connected with each other through conductor layer CL4. As a result, electrode EL1, conductor layer CL3, electrode EL3 and conductor layer CL4 constitute coil CO. Axis AX of coil CO (FIG. 14) is in the direction of the x axis. Normal line NL of bottom face LS of semiconductor package SP4 is in the direction of the z axis. Namely, axis AX and normal line NL are orthogonal to each other.

Wiring for signal input/output (not shown) electrically connected with coil CO is formed in each of semiconductor chips ST1-ST3. Signal transmission between each of semiconductor chips ST1-ST3 and coil CO is carried out through these wirings.

Each of electrodes EL1-EL4 of the present embodiment is formed, for example, as set forth below. First, a through hole is formed using a laser drill at a position where electrodes EL1-EL4 are to be formed in each of semiconductor chips ST1-ST3. A bump of Au, for example, is inserted in the through holes. Then, semiconductor chips ST1-ST3 are stacked, and subjected to pressure from the topmost side. Accordingly, the Au bumps are bonded with each other to constitute electrodes EL1-EL4.

According to package-on-package PP of the present embodiment, advantages similar to those of the package-on-package of the first embodiment can be achieved.

In addition, according to package-on-package PP of the present embodiment, semiconductor package SP4 has a plurality of stacked semiconductor chips ST1-ST3. Each of semiconductor chips ST1-ST3 is electrically connected with each other by electrodes EL1-EL4 penetrating each of semiconductor chips ST1-ST3 in accordance with normal line NL. At least a portion of coil CO is configured by electrodes EL1 and EL3. Accordingly, a portion of the coil can be established simultaneous to the step of stacking the semiconductor chips. Therefore, the mounting cost and mounting time can be reduced.

The present embodiment is described based on a configuration in which three semiconductor chips ST1-ST3 are stacked. The number of stacked semiconductor chips is arbitrary. Furthermore, at least a portion of coil CO may be configured by a through electrode which can be one of electrodes EL1 and EL3.

Fifth Embodiment

Figure 15:
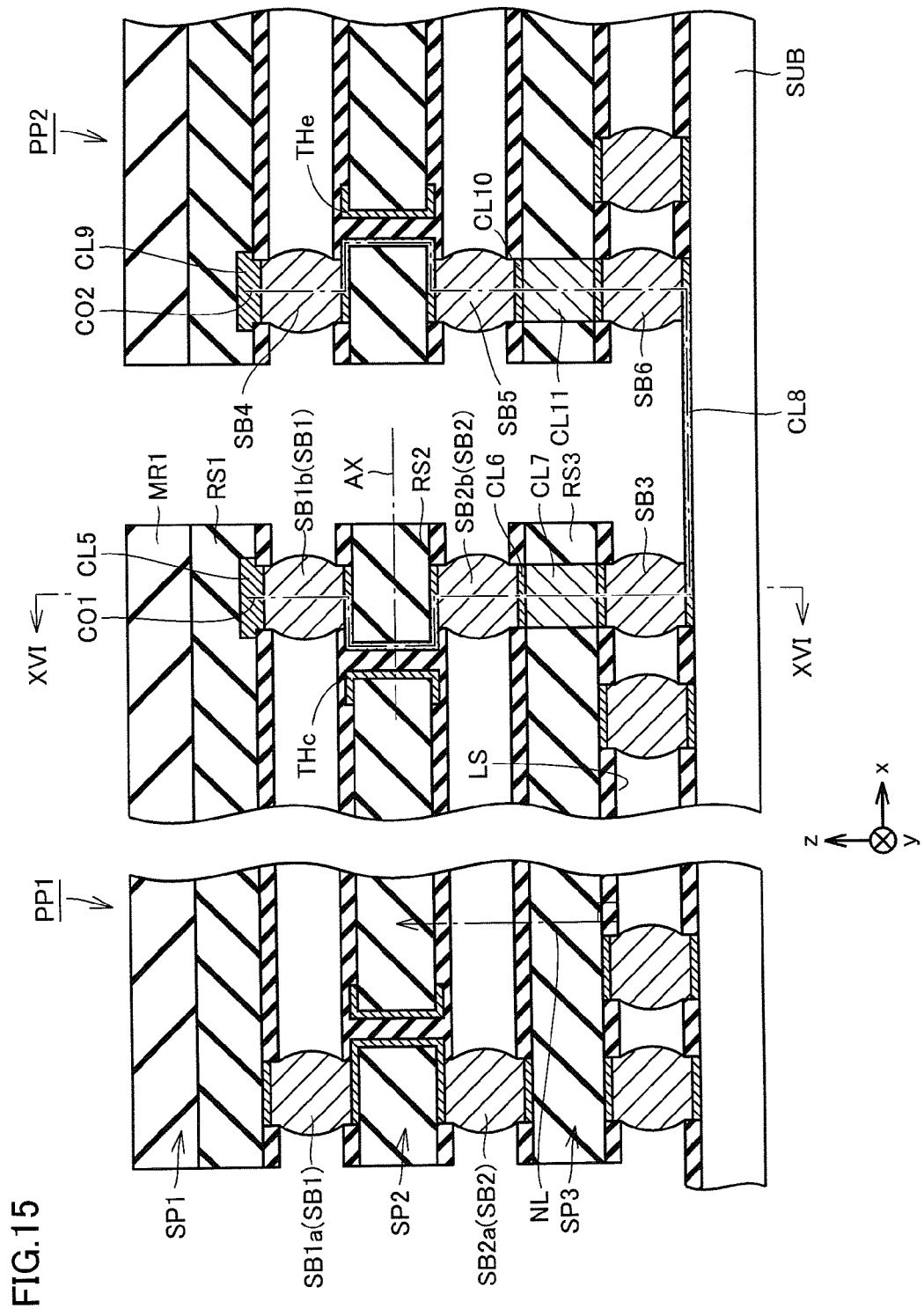
FIG. 15 is a partial sectional view of a configuration of a semiconductor device according to a fifth embodiment of the present invention, cut at the xz plane.
Figure 16:
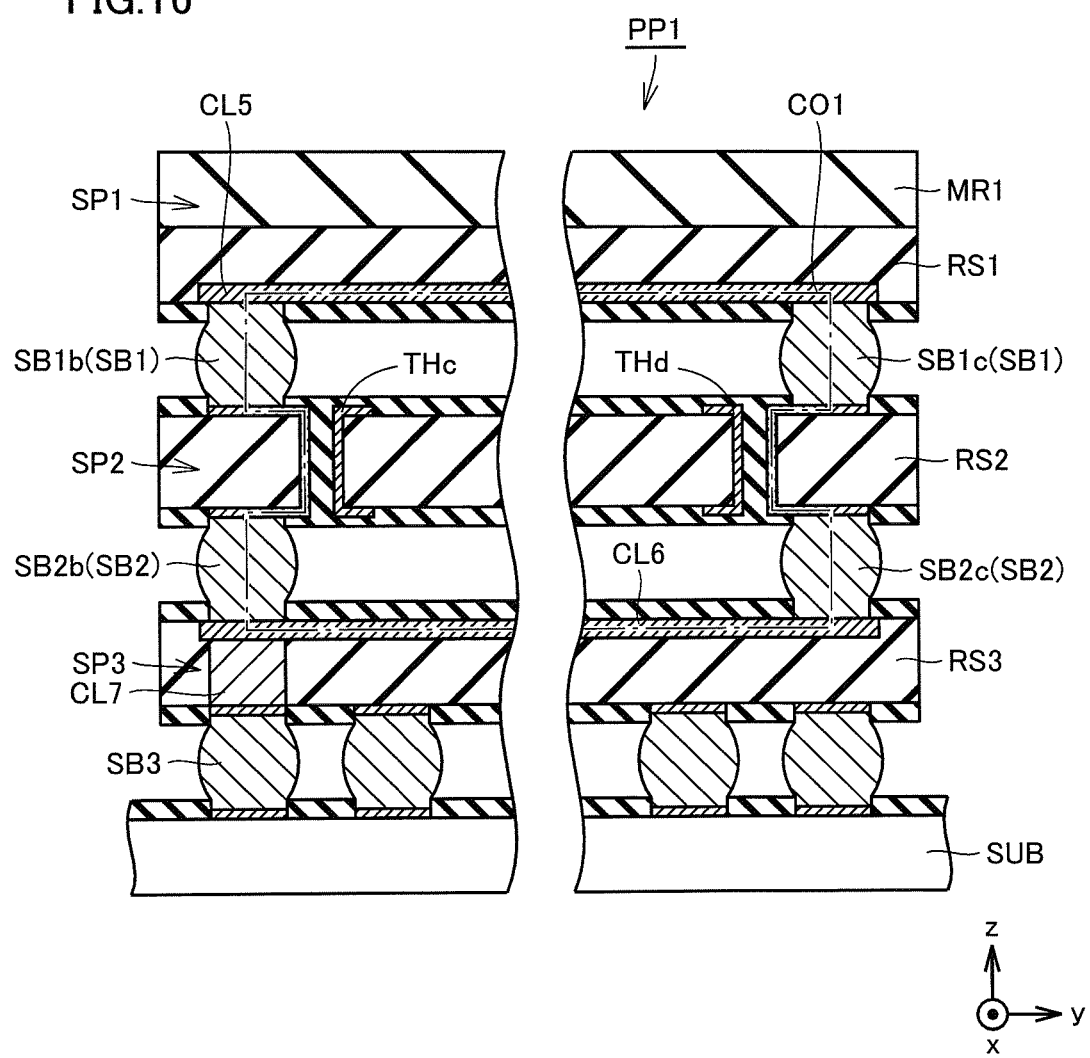
FIG. 16 is a partial sectional view of a configuration of a semiconductor device according to the fifth embodiment of the present invention, cut at the yx plane.
Figure 17:
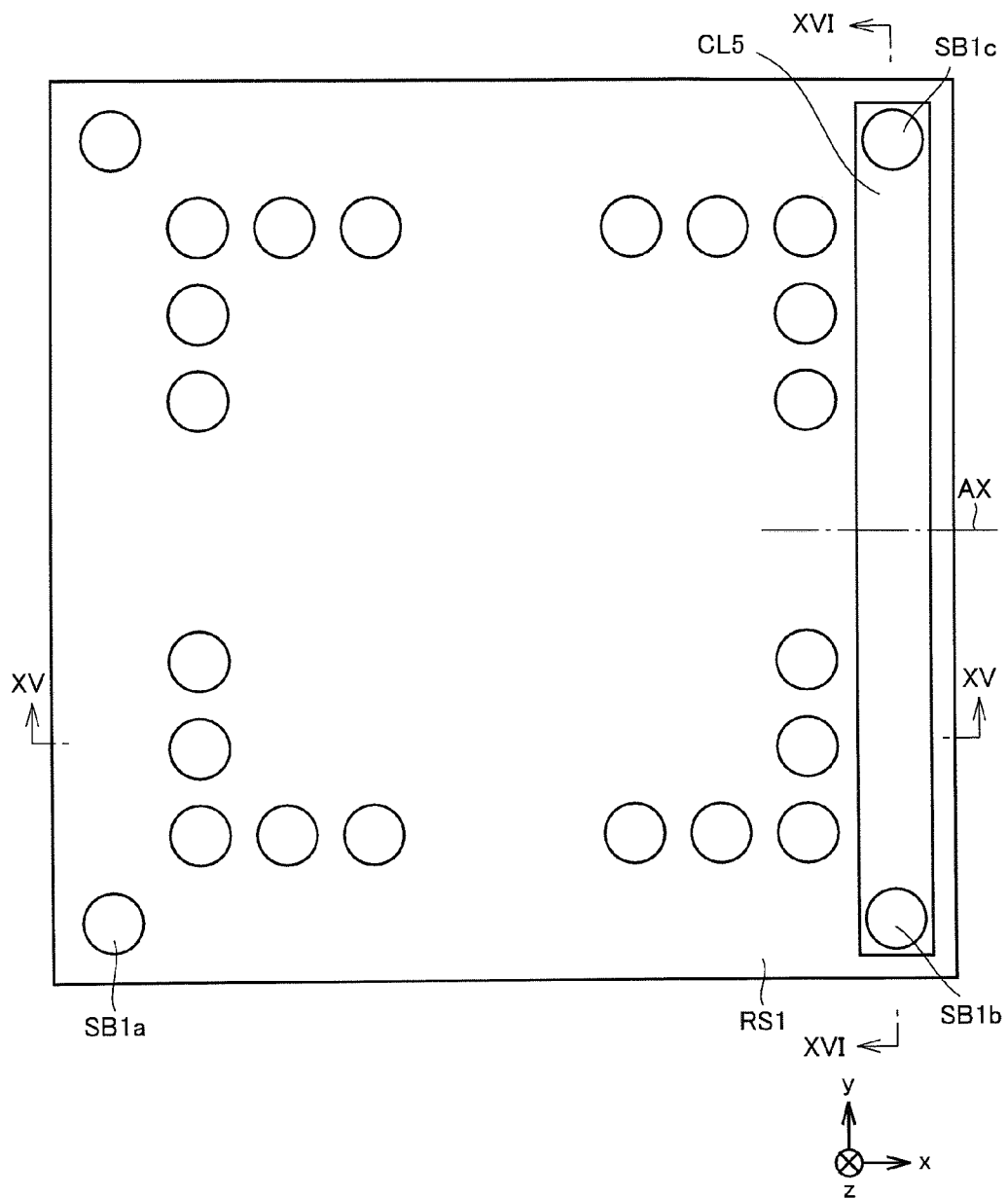
FIG. 17 is a bottom view of a resin substrate RS1 in the semiconductor device according to the fifth embodiment of the present invention.

FIGS. 15-17 represent a configuration of a semiconductor device according to a fifth embodiment of the present invention. FIGS. 15 and 16 are partial sectional views taken along the xz plane (along line XV-XV in FIG. 17) and the yx plane (along line XVI-XVI in FIG. 17), respectively. FIG. 17 is a bottom view of resin substrate RS1. Referring to FIGS. 15-17, package-on-package PP1 that is a semiconductor device of the present embodiment differs from the package-on-package of the third embodiment in the pattern of the conductor layers in the semiconductor package.

Referring particularly to FIG. 16, a conductor layer CL5 is formed at a bottom face of resin substrate RS1, and a conductor layer CL6 is formed at the top face of resin substrate RS3. Each of conductor layers CL5 and CL6 extends in the direction of the y axis (horizontally in FIG. 16). The portion of conductor layer CL5 corresponding to the left end view in FIG. 16 is electrically connected with the left end portion of conductor layer CL6 through solder ball SB1$b$ of semiconductor package SP1, through hole THc in resin substrate RS2, and solder ball SB2$b$ of semiconductor package SP2. Similarly, conductor layer CL5 has its right end portion connected electrically connected to the right end portion of conductor layer CL6 through solder ball SB1$c$ of semiconductor package SP1, through hole THd in resin substrate RS2, and solder ball SB2$c$ of semiconductor package SP2. As a result, conductor layer CL5, solder ball SB1$b$, through hole THc, solder ball SB2$b$, conductor layer CL6, solder ball SB2$c$, through hole THd and solder ball SB1$c$ constitute coil CO1. Referring particularly to FIG. 15, axis AX of coil CO1 is in the direction of the x axis. Normal line NL of bottom face LS of semiconductor package SP3 is in the direction of the z axis. Namely, axis AX and normal line NL are orthogonal to each other.

Further, a conductor layer CL7 is formed in resin substrate RS3. Conductor layer CL7 electrically connects conductor layer CL6 with one solder ball SB3 (connection electrode) of semiconductor package SP3. Accordingly, coil CO1 is further configured by conductor layer CL7 and solder ball SB3. Solder ball SB3 is directly electrically connected with conductor layer CL8 (wiring) of substrate SUB on which semiconductor package SP3 is mounted. Coil CO1 is electrically connected with coil CO2 of another package-on-package PP2 through conductor layer CL8. Package-on-package PP2 takes a mirror symmetrical configuration with package-on-package PP1 about the yz plane. Namely, coil CO2 includes conductor layer CL9, solder ball SB4, through hole THe, solder ball SB5, conductor layer CL10, conductor layer CL11, and solder ball SB6.

The remaining configuration of package-on-package PP1 is similar to that of the package-on-package of the third embodiment. Therefore, corresponding members have the same reference character allotted, and description thereof will not be repeated.

According to package-on-package PP of the present embodiment, advantages similar to those of the package-on-package of the first embodiment can be provided.

In addition, at least a portion of coil CO1 is configured by solder ball SB3 in package-on-package PP1 of the present embodiment. Solder ball SB3 is configured to be directly connected to conductor layer CL8 of substrate SUB, and coil CO1 is electrically connected with coil CO2 of another package-on-package PP2 through conductor layer CL8. Accordingly, the coil of each package-on-package can be connected to increase the number of windings of the coil. Furthermore, using these coils, communication with an external apparatus such as a tester can be carried out.

Sixth Embodiment

Figure 18:
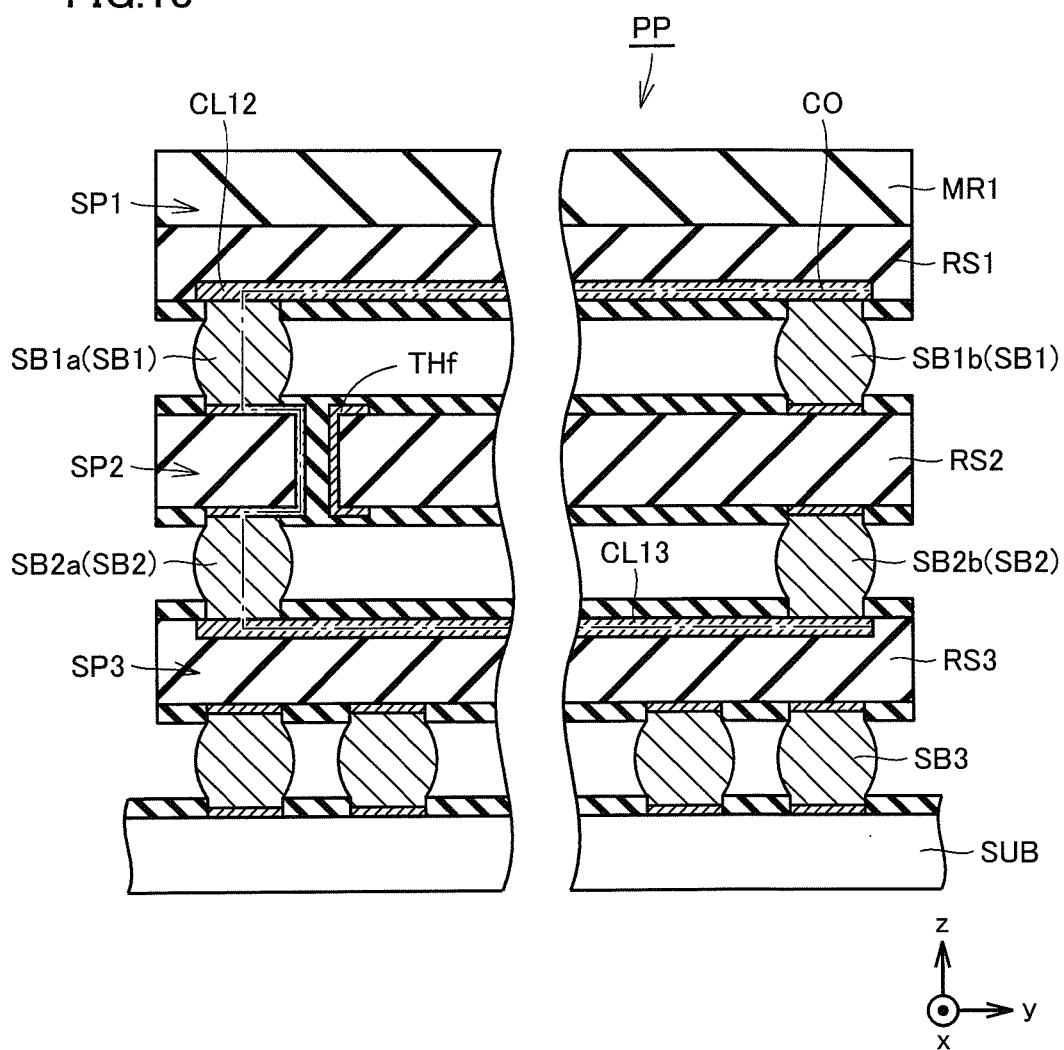
FIG. 18 is a partial sectional view of a configuration of a semiconductor device according to a sixth embodiment of the present invention, cut at the yz plane.
Figure 19:
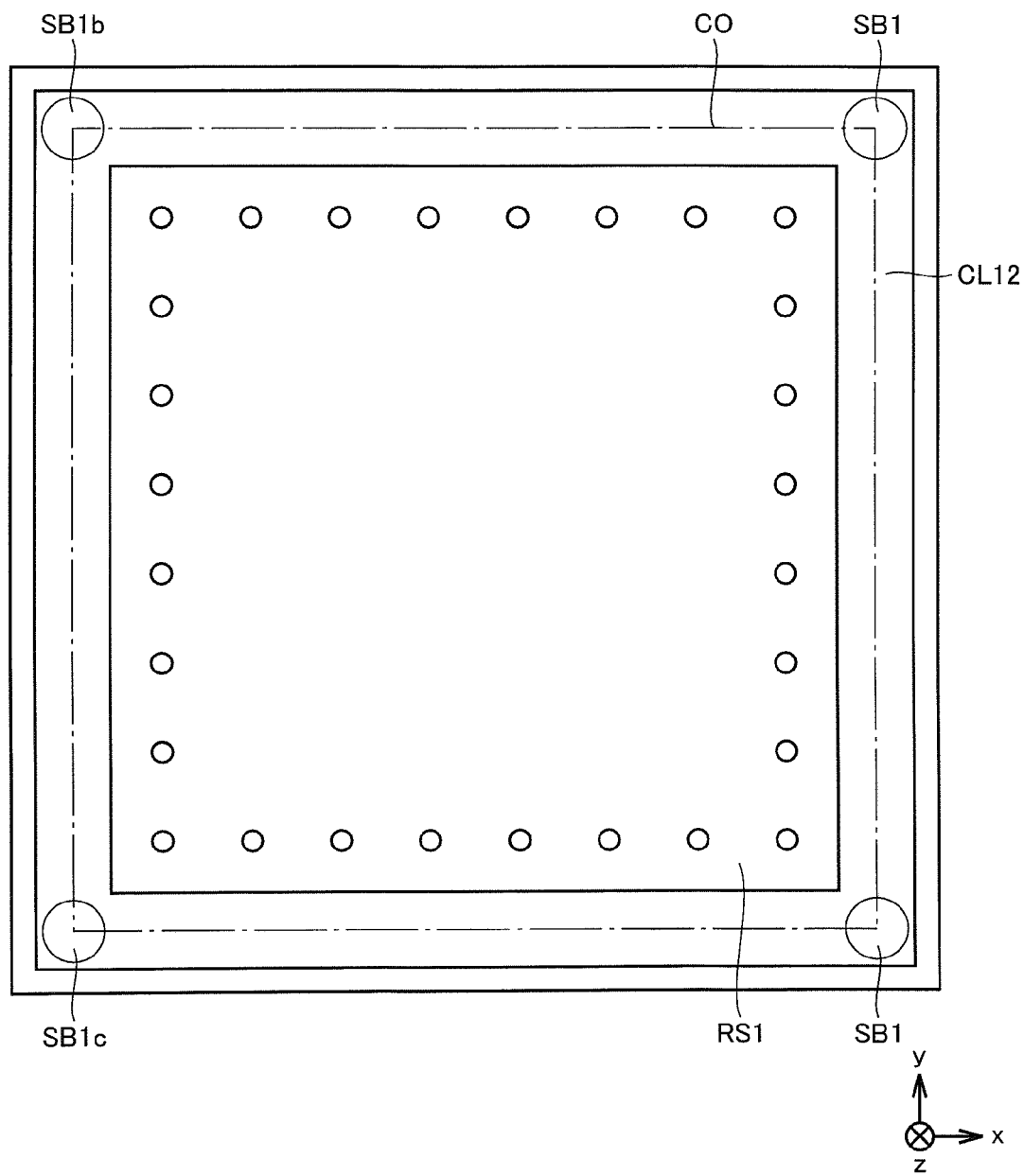
FIG. 19 is a bottom view of a resin substrate RS1 in the semiconductor device according to the sixth embodiment of the present invention.
Figure 20:
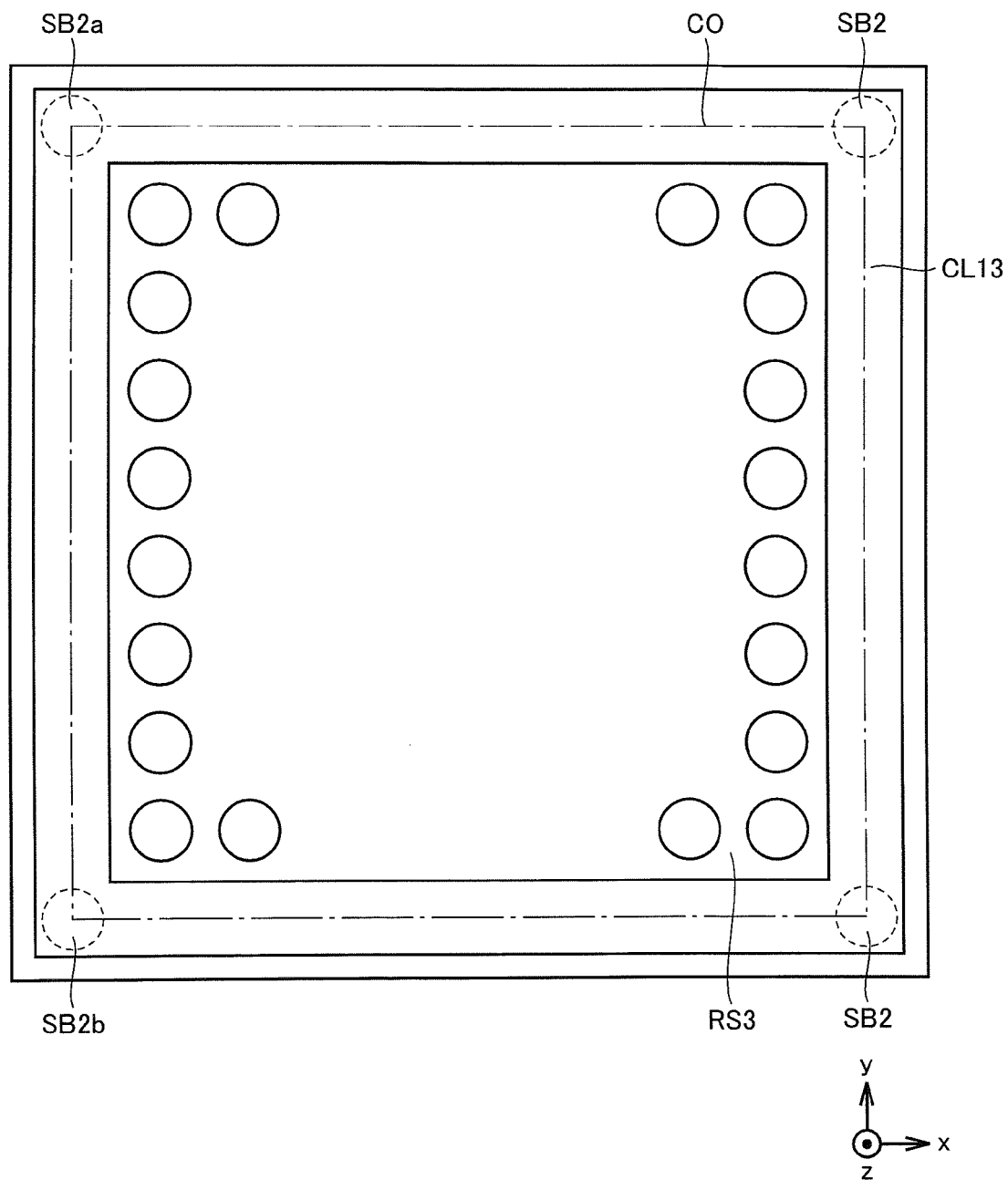
FIG. 20 is a top view of a resin substrate RS3 in the semiconductor device according to the sixth embodiment of the present invention.

FIGS. 18-20 represent a configuration of a semiconductor device according to a sixth embodiment of the present invention. FIG. 18 is a partial sectional view taken along the yz plane; FIG. 19 is a bottom view of resin substrate RS1; and FIG. 20 is a top view of resin substrate RS3. Referring to FIGS. 18-20, package-on-package PP that is a semiconductor device of the present embodiment differs from the package-on-package of the third embodiment in the pattern of the conductor layer in the semiconductor package.

Referring particularly to FIG. 19, conductor layer CL12 is formed at the bottom face of resin substrate RS1 of semiconductor package SP1 (upper semiconductor package). Conductor layer CL12 has an annular plane configuration, formed in accordance with the perimeter of resin substrate RS1. At each of the four corners of conductor layer CL12, four solder balls SB1 of semiconductor package SP1 including solder balls SB1$a$ and SB1$b$ (upper electrode) are provided. Similarly, referring particularly to FIG. 20, a conductor layer CL13 is formed at the top face of resin substrate RS3 of semiconductor package SP3 (semiconductor package). Conductor layer CL13 has an annular plane configuration, formed in accordance with the perimeter of resin substrate RS3. At each of the four corners of conductor layer CL13, four solder balls SB2 of semiconductor package SP2 including solder balls SB2$a$ and SB2$b$ (upper electrode) are in contact. Referring particularly to FIG. 18, conductor layers CL12 and CL13 are electrically connected with each other through solder ball SB1$a$, through hole THf and solder ball SB2$a$. As a result, conductor layer CL12, conductor layer CL13, solder ball SB1a, through hole THf and solder ball SB2a constitute coil CO having two loops. By this coil CO, communication in the direction of the z axis is allowed.

The remaining configuration of package-on-package PP1 is similar to that of the package-on-package of the third embodiment. Therefore, the same members have the same reference characters allotted, and description thereof will not be repeated.

Package-on-package PP of the present embodiment includes semiconductor package SP3, semiconductor package SP1, and coil CO. Semiconductor package SP1 is mounted above semiconductor package SP3, and includes solder bumps SB1a and SB1b electrically connected with semiconductor package SP3. Coil CO has at least a portion provided at semiconductor package SP3. Coil CO has at least a portion configured by solder bumps SB1a and SB1b.

According to package-on-package PP of the present embodiment, the mechanical work of winding a coil can be dispensed with since at least a portion of coil CO is configured by solder balls SB1a and SB1b. The cost and time for mounting a coil can be reduced. Furthermore, by establishing a coil spanning between a plurality of semiconductor packages, the number of coil windings can be increased to form an intensive coil.

Furthermore, since at least a portion of coil CO is configured by conductor layer CL12 formed in semiconductor package SP1 and conductor layer CL13 formed in semiconductor package SP3, the cost and time required for mounting a coil can be further reduced. In addition, the radius of the coil can be increased, as compared to a coil formed at a semiconductor chip.

Seventh Embodiment

Figure 21:
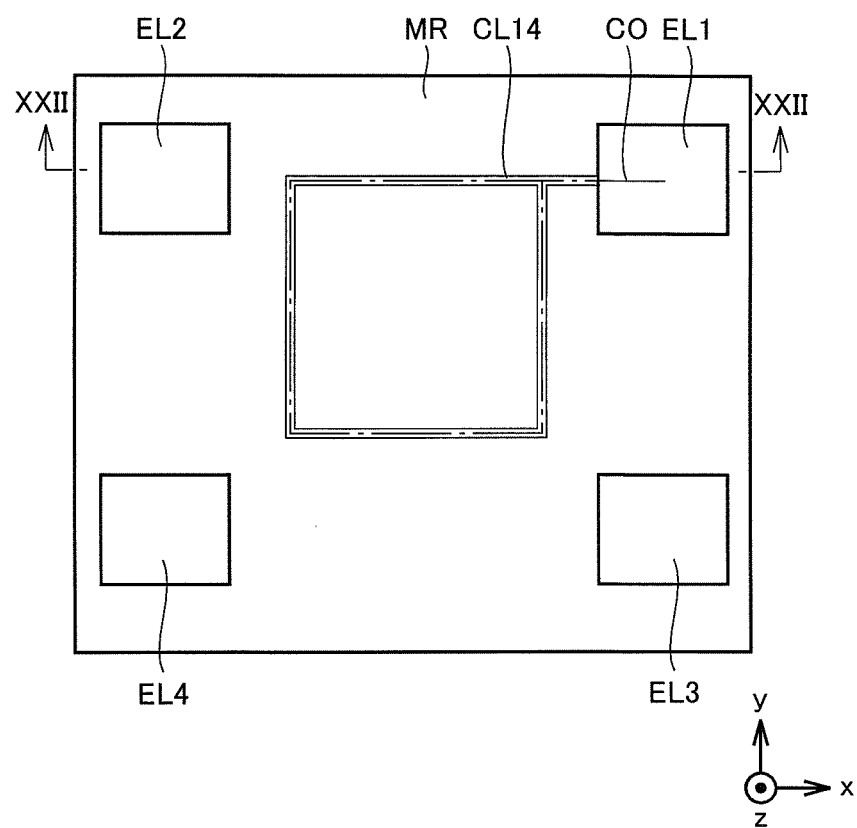
FIG. 21 represents a plane layout of electrodes and conductor layers in a semiconductor device according to a seventh embodiment of the present invention.
Figure 22:
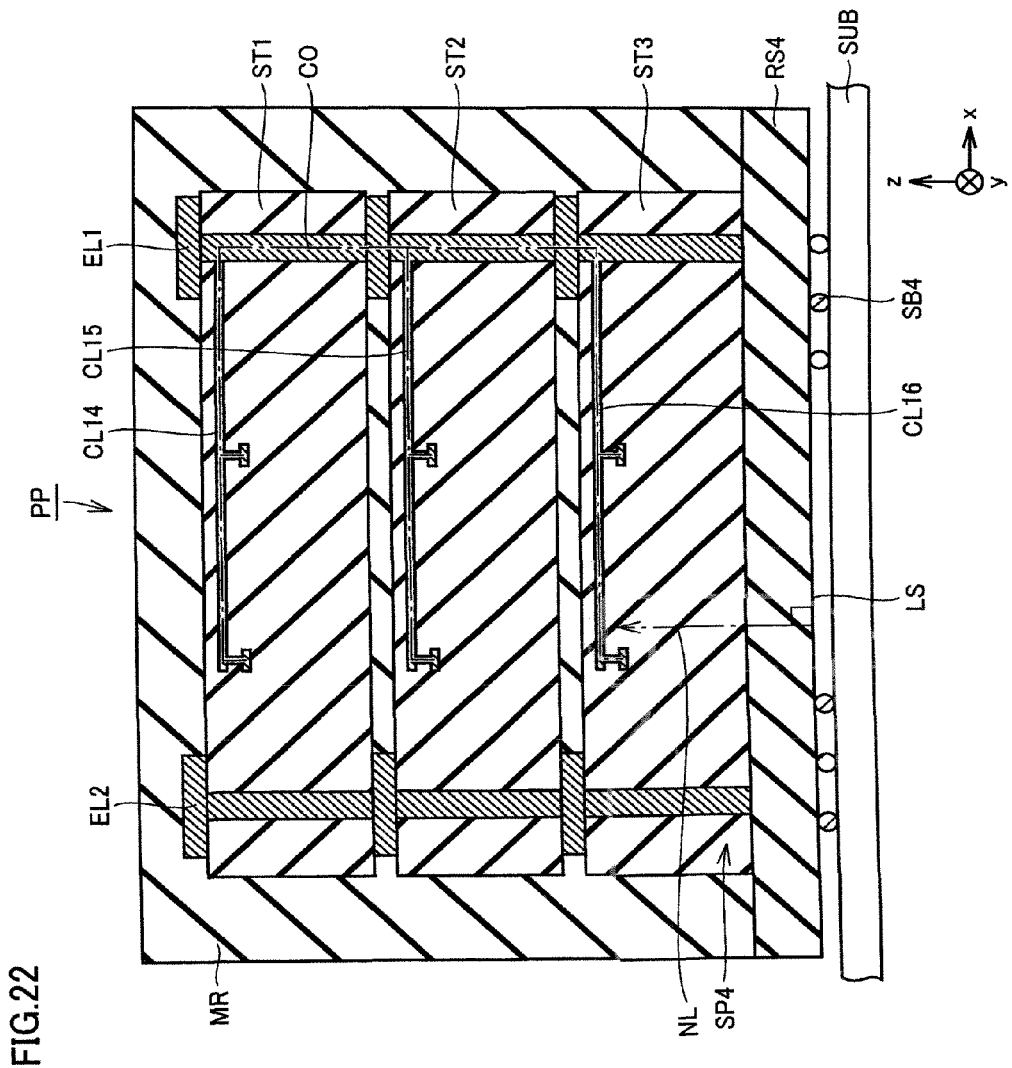
FIG. 22 is a sectional view taken along line XXII-XXII of FIG. 21.

FIGS. 21 and 22 represent a configuration of a semiconductor device according to a seventh embodiment of the present invention. FIG. 21 represents a plan layout of electrodes and conductor layers. FIG. 22 is a sectional view taken along line XXII-XXII of FIG. 21. Referring to FIGS. 21 and 22, package-on-package PP that is a semiconductor device of the present embodiment differs from the package-on-package of the fourth embodiment in the pattern of the conductor layers in the semiconductor chip.

In the vicinity of the four corners of semiconductor package SP4 having a rectangular plane configuration, electrodes EL1-EL4, formed of Au, for example, are provided. Each of electrodes EL1-EL4 penetrates semiconductor chips ST1-ST3. Each of semiconductor chips ST1-ST3 is electrically connected with each other through electrodes EL1-EL4. Furthermore, a conductor layer CL14 is formed in semiconductor chip ST1. A conductor layer CL15 is formed in semiconductor chip ST2. A conductor layer CL16 is formed in semiconductor chip ST3. Each of conductor layers CL14-CL16 is electrically connected with electrode EL1, and has a plane configuration corresponding to the four sides of a rectangular, for example. Namely, conductor layers CL4-CL16 and electrode EL1 constitute coil CO having three loops. By this coil CO, communication in the vertical direction is allowed.

Each of semiconductor chips ST1-ST3 has formed therein a wiring for signal input/output (not shown) electrically connected with coil CO. Signal transmission between each of semiconductor chips ST1-ST3 and coil CO is carried out through these wirings.

According to package-on-package PP of the present embodiment, advantages similar to those of the package-on-package of the sixth embodiment can be achieved.

In addition, according to package-on-package PP of the present embodiment, semiconductor package SP4 includes a plurality of stacked semiconductor chips ST1-ST3. Each of semiconductor chips ST1-ST3 is electrically connected with each other by electrodes EL1-EL4 penetrating each of semiconductor chips ST1-ST3 in accordance with normal line NL. At least a portion of coil CO is configured by electrode EL1. Accordingly, a portion of the coil can be established simultaneous to the step of stacking semiconductor chips, allowing the mounting cost and mounting time to be reduced.

In the present embodiment, a configuration in which three semiconductor chips SP1-SP3 are stacked has been described. The number of stacked semiconductor chips is arbitrary. Furthermore, it is required that only at least a portion of coil CO is to be configured by the through electrode, and only one of electrodes EL1 and EL3 may be a through electrode.

In the present invention, the semiconductor device may include two or more coils. Accordingly, one coil may be directed to transmission and the other coil directed to reception. The number and layout of the semiconductor packages, the number and layout of the semiconductor chips, the number and layout of the solder balls, and the number of windings of the coil are arbitrary. Furthermore, the connection electrode is at least an electrode of the semiconductor package, and may be a conductor other than a solder bump such as a carbon nanotube.

Further, the present invention is applicable to a semiconductor package of large thickness, or an SIP (System In Package), in addition to the package-on-package set forth above. Particularly, since a package-on-package often has a thickness of several mm in the direction of the height (direction of the z axis), a coil can be readily formed by taking advantage of this thickness.

Furthermore, the configuration described above in the first to seventh embodiments can be combined appropriately.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

The present invention is suitable as a semiconductor device mounted on a portable apparatus requiring low power. The present invention is also suitable to a product that can be readily accommodated by exchanging the semiconductor device. Furthermore, since communication is allowed without having to use a metal contact, the present invention is suitable as a semiconductor device mounted on a product that requires waterproof features such as a digital camera directed to an underwater camera.

DESCRIPTION OF THE REFERENCE SIGNS

AX axis; CL1-CL16 conductor layer; CO, CO1, CO2 coil; DB delay buffer; EL1-EL4 electrode; FF storage element; INV1 reception buffer; INV2, INV3 transmission buffer; L1 transmission coil; L2 reception coil; LD, LDa, LDb and; LS semiconductor package bottom face; MR, MR1-MR3 mold resin; NAND1, NAND2 NAND circuit; NL normal line of semiconductor package bottom face; PP, PP1, PP2 package-on-package; R1 resistor; RS1-RS4 resin substrate; $R_{xclk}$ reception clock; $R_{xdata}$ reception data; SB1, SB1a-SB1c, SB2, SB2a-SB2c, SB3-SB6 solder ball; SP1-SP4 semiconductor package; SR3 solder resist; ST1-ST3 semiconductor chip; SUB substrate; T1-T10 transistor; THa-THf through hole; $T_{xclk}$ transmission clock, $T_{xdata}$ transmission data; $V_{bias}$ bias voltage.

The invention claimed is:

1. A semiconductor device comprising:
   a semiconductor package including a main plane and a connection electrode protruding from said main plane, and
   a coil having at least a portion provided at said semiconductor package,
   said coil having an axis inclined with respect to a normal line of said main plane,
   wherein said coil is configured to be directly connected to a wiring of a substrate where said semiconductor package is mounted, and to be electrically connected to a coil of another semiconductor device through said wiring.

2. The semiconductor device according to claim 1, wherein the axis of said coil is orthogonal to the normal line of said main plane.

3. The semiconductor device according to claim 1, wherein said coil has at least a portion configured by a conducting wire.

4. The semiconductor device according to claim 1, further comprising an upper semiconductor package mounted on said semiconductor package, and including an upper connection electrode electrically connected with said semiconductor package,
   wherein at least a portion of said coil is configured by said upper connection electrode.

5. The semiconductor device according to claim 4, wherein at least a portion of said coil is configured by a conductor layer formed in said semiconductor package, and an upper conductor layer formed in said upper semiconductor package.

6. The semiconductor device according to claim 1, wherein said semiconductor package includes a plurality of stacked semiconductor chips, and a through electrode electrically connecting each of said plurality of semiconductor chips with each other by penetrating each of said semiconductor chips in accordance with said normal line, and
   at least a portion of said coil is configured by said through electrode.

7. The semiconductor device according to claim 1, wherein wireless communication is carried out based on a change in a magnetic field generated by said coil.

* * * * *